United States Patent
Yamawaki et al.

(10) Patent No.: US 11,937,375 B2
(45) Date of Patent: Mar. 19, 2024

(54) WIRELESS COMMUNICATION DEVICE MANUFACTURING METHOD AND WIRELESS COMMUNICATION DEVICE MANUFACTURING APPARATUS

(71) Applicant: Murata Manufacturing Co., Ltd., Nagaokakyo (JP)

(72) Inventors: Yoshinori Yamawaki, Nagaokakyo (JP); Ryosuke Washida, Nagaokakyo (JP); Noboru Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/225,434

(22) Filed: Apr. 8, 2021

(65) Prior Publication Data

US 2021/0227737 A1 Jul. 22, 2021

Related U.S. Application Data

(63) Continuation of application No. PCT/JP2019/033336, filed on Aug. 26, 2019.

(30) Foreign Application Priority Data

Oct. 15, 2018 (JP) .................. 2018-194417

(51) Int. Cl.
*H05K 13/04* (2006.01)
*B32B 37/22* (2006.01)
*H04B 1/3827* (2015.01)

(52) U.S. Cl.
CPC ......... *H05K 13/0469* (2013.01); *B32B 37/22* (2013.01); *H04B 1/3827* (2013.01); *H05K 13/0404* (2013.01)

(58) Field of Classification Search
CPC ............ H05K 13/0404; H05K 13/041; H05K 13/0469; H05K 3/305; H04B 1/3827;
(Continued)

(56) References Cited

U.S. PATENT DOCUMENTS

2004/0082111 A1* 4/2004 Yamauchi ............... H01L 24/81
257/E21.511
2007/0284759 A1 12/2007 Suguro et al.
(Continued)

FOREIGN PATENT DOCUMENTS

JP 2005284772 A 10/2005
JP 2005309960 A 11/2005
(Continued)

OTHER PUBLICATIONS

Japanese Office Action issued for JP Application No. 2020-087861, dated Dec. 15, 2021.
(Continued)

*Primary Examiner* — John L Goff, II
(74) *Attorney, Agent, or Firm* — ArentFox Schiff LLP

(57) ABSTRACT

A material sheet is provided having antenna patterns that include first and second coupling portions that are transported toward a mounting position, and an adhesive member that is disposed on the material sheet before reaching the mounting position. At a pickup position, a mounting device picks up an RFIC module including an RFIC chip and first and second terminal electrodes connected to the RFIC chip. At the mounting position, the mounting device mounts the picked-up RFIC module onto the adhesive member on the material sheet so that the first coupling portion and the first terminal electrode face each other and so that the second coupling portion and the second terminal electrode face each other.

16 Claims, 18 Drawing Sheets

(58) Field of Classification Search
CPC .............. B32B 37/22; G06K 19/07718; G06K 19/07754; G06K 19/07749; H01L 21/67144; Y10T 156/1092; Y10T 156/1771; Y10T 156/178; Y10T 156/1097
See application file for complete search history.

(56) References Cited

U.S. PATENT DOCUMENTS

2012/0021233 A1* 1/2012 Hayakawa .............. H01L 24/32
                                                                                156/60
2019/0138871 A1    5/2019 Kato

FOREIGN PATENT DOCUMENTS

| JP | 2005339502 A | 12/2005 |
| JP | 2007108983 A | 4/2007 |
| JP | 2013242698 A | 12/2013 |
| WO | 2018012391 A1 | 1/2018 |

OTHER PUBLICATIONS

International Search Report issued for PCT/JP2019/033336, dated Oct. 8, 2019.
Written Opinion of the International Searching Authority issued for PCT/JP2019/033336, dated Oct. 8, 2019.

* cited by examiner

MOUNTING

US 11,937,375 B2

WIRELESS COMMUNICATION DEVICE MANUFACTURING METHOD AND WIRELESS COMMUNICATION DEVICE MANUFACTURING APPARATUS

CROSS REFERENCE TO RELATED APPLICATIONS

The present application is a continuation of PCT/JP2019/033336 filed Aug. 26, 2019, which claims priority to Japanese Patent Application No. 2018-194417, filed Oct. 15, 2018, the entire contents of each of which are incorporated herein by reference.

TECHNICAL FIELD

The present invention relates to a wireless communication device manufacturing method and a wireless communication device manufacturing apparatus.

BACKGROUND

International Publication No. 2018/012391 (hereinafter "Patent Document 1") discloses an RFID tag (wireless communication device) manufacturing method in which a base film (antenna base material) having antenna patterns is transported in its longitudinal direction toward a mounting position so that an RFIC (Radio-Frequency Integrated Circuit) element (RFIC module) with sticker is attached to the antenna patterns at the mounting position. The RFIC element with sticker affixed to a tape is picked up and the picked-up RFIC element with sticker is attached to the antenna patterns.

In the case of the manufacturing method described in Patent Document 1, however, due to the necessity to remove the RFIC element with sticker from the tape for picking up, it takes time to pick it up. As a result, mounting the RFIC element takes time.

SUMMARY OF THE INVENTION

Accordingly, exemplary embodiments of the present invention provide a wireless communication device having antenna patterns and an RFIC module that includes an RFIC chip, with the RFIC module mounted onto the antenna patterns in a short time.

Moreover, according to an exemplary aspect of the present invention, a wireless communication device manufacturing method is provided comprising: transporting a material sheet having antenna patterns including first and second coupling portions, toward a mounting position; disposing an adhesive member on the material sheet before reaching the mounting position; picking up by a mounting device an RFIC module including an RFIC chip and first and second terminal electrodes connected to the RFIC chip, at a pickup position; and mounting the picked-up RFIC module onto the adhesive member on the material sheet at the mounting position so that the first coupling portion and the first terminal electrode face each other and so that the second coupling portion and the second terminal electrode face each other.

According to another exemplary aspect, a wireless communication device manufacturing apparatus is provided that includes a transporting device that transports a material sheet having antenna patterns including first and second coupling portions, toward a mounting position; an applying device that applies an adhesive member to the material sheet before reaching the mounting position; and a mounting device that picks up, at a pickup position, an RFIC module including an RFIC chip and first and second terminal electrodes connected to the RFIC chip. Moreover, the mounting device mounts, at the mounting position, the picked-up RFIC module onto the adhesive member on the material sheet so that the first coupling portion and the first terminal electrode face each other and so that the second coupling portion and the second terminal electrode face each other.

According to the exemplary embodiments of the present invention, in a wireless communication device having antenna patterns and an RFIC module including an RFIC chip, the RFIC module can be mounted on the antenna patterns in a short time.

DETAILED DESCRIPTION

Figure 1:
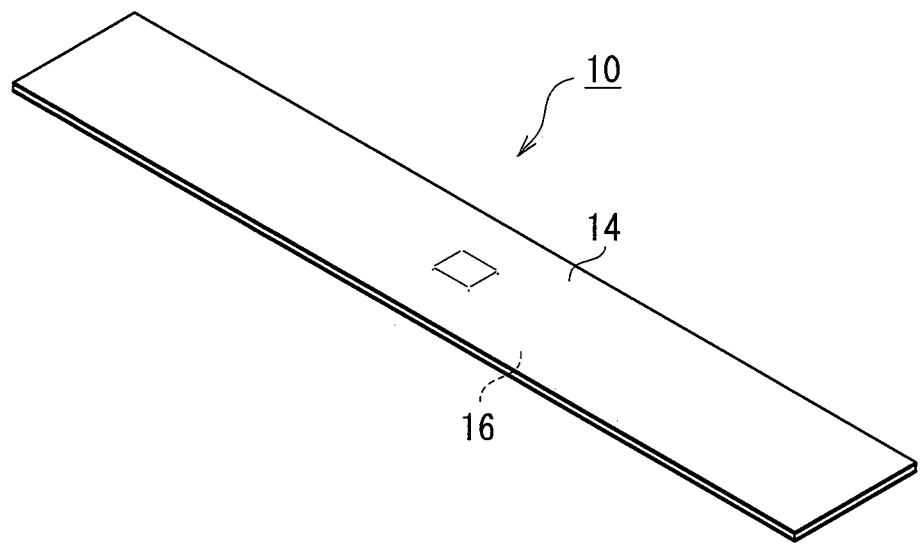
FIG. 1 is a perspective view of a wireless communication device according to an exemplary aspect.
Figure 1:
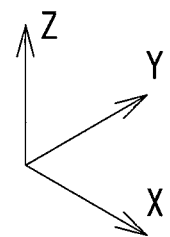

A wireless communication device manufacturing method of an exemplary aspect is disclosed that includes transporting a material sheet having antenna patterns including first and second coupling portions, toward a mounting position; disposing an adhesive member on the material sheet before reaching the mounting position; a mounting device picking up an RFIC module including an RFIC chip and first and second terminal electrodes connected to the RFIC chip, at a pickup position; and mounting the picked-up RFIC module onto the adhesive member on the material sheet at the mounting position so that the first coupling portion and the first terminal electrode face each other and so that the second coupling portion and the second terminal electrode face each other.

According to the exemplary aspect, in the wireless communication device having the antenna patterns and the RFIC module including the RFIC chip, the RFIC module can be mounted on the antenna patterns in a short time.

For example, the material sheet having the antenna patterns can be pulled out from a feed reel around which the material sheet is wound, to be transported toward the mounting position, and the adhesive member can be an insulating sticky layer and may be disposed on the material sheet in a state of being wound around the feed reel.

For example, in a stacking direction of the material sheet, the adhesive member, and the RFIC module, the size of the first coupling portion is larger than the size of the first terminal electrode, and the size of the second coupling portion is larger than the size of the second terminal electrode, while in the stacking direction, the pitch spacing between the first coupling portion and the second coupling portion and the pitch spacing between the first terminal electrode and the second terminal electrode are specified so that the first terminal electrode can lie at the center of the first coupling portion and so that the second terminal electrode can lie at the center of the second coupling portion. Hereby, even if there is some variation at the adhesion position of the RFIC module with respect to the material sheet, the first terminal electrode and the first coupling portion can be electrically connected facing each other and the second terminal electrode and the second coupling portion can be electrically connected facing each other. As a result, it is only necessary to position the RFIC module with respect to the material sheet with a certain degree of accuracy, thus enabling the RFIC module to be mounted on the antenna patterns at a high speed as compared with conventional techniques.

For example, in the stacking direction, a first region enclosing the first and second terminal electrodes in a minimum area is smaller than the adhesive member and lies within a contour line of the adhesive member, and the adhesive member is smaller than a second region enclosing the first and second coupling portions in a minimum area and lies within the second region. Hereby, when positioning the RFIC module with respect to the first and second coupling portions, the RFIC module can be reliably mounted on the adhesive member.

In an exemplary aspect, the mounting device comprises a mounting head having a plurality of nozzles each sucking and holding the RFIC module, the material sheet is transported toward the mounting position while each of the plurality of nozzles of the mounting head is picking up the RFIC module at the pickup position, and a portion of the material sheet lying at the mounting position is fixed while the plurality of nozzles of the mounting head are mounting the RFIC module onto the adhesive member on the material sheet. This configuration enables the plurality of RFIC modules to be mounted on the antenna patterns in a short time.

For example, the material sheet having the RFIC module mounted at the mounting position may be wound up by a recovery reel.

For example, in the case where R is a radius of a winding shaft of the recovery reel and H is a thickness of the RFIC module, it is preferred that a protrusion amount B of the adhesive member protruding in a winding direction from the RFIC module satisfy Equation 1. This restrains the adhesive member from adhering to the material sheet facing with the RFIC module in between.

$$B < \left(R \times \cos^{-1}\left(\frac{R}{R+H}\right)\right) \div 2 \qquad \text{(Eq. 1)}$$

In an exemplary aspect, the RFIC module may comprise a matching circuit disposed between the RFIC chip and the first and second terminal electrodes. Hereby, even if there occur variations in distance, i.e., variations in capacitance between the coupling portions and the terminal electrodes, the communication characteristics of the wireless communication device are not substantially affected.

Moreover, a wireless communication device manufacturing apparatus of an exemplary aspect includes a transporting device that transports a material sheet having antenna patterns including first and second coupling portions, toward a mounting position; an applying device that applies an adhesive member to the material sheet before reaching the mounting position; and a mounting device that picks up, at a pickup position, an RFIC module including an RFIC chip and first and second terminal electrodes connected to the RFIC chip. Moreover, the mounting device mounts, at the mounting position, the picked-up RFIC module onto the adhesive member on the material sheet so that the first coupling portion and the first terminal electrode face each other and so that the second coupling portion and the second terminal electrode face each other.

According to the exemplary aspect, in the wireless communication device having the antenna patterns and the RFIC module including the RFIC chip, the RFIC module can be mounted on the antenna patterns in a short time.

Exemplary embodiments of the present invention will hereinafter be described with reference to the drawings.

Figure 2:
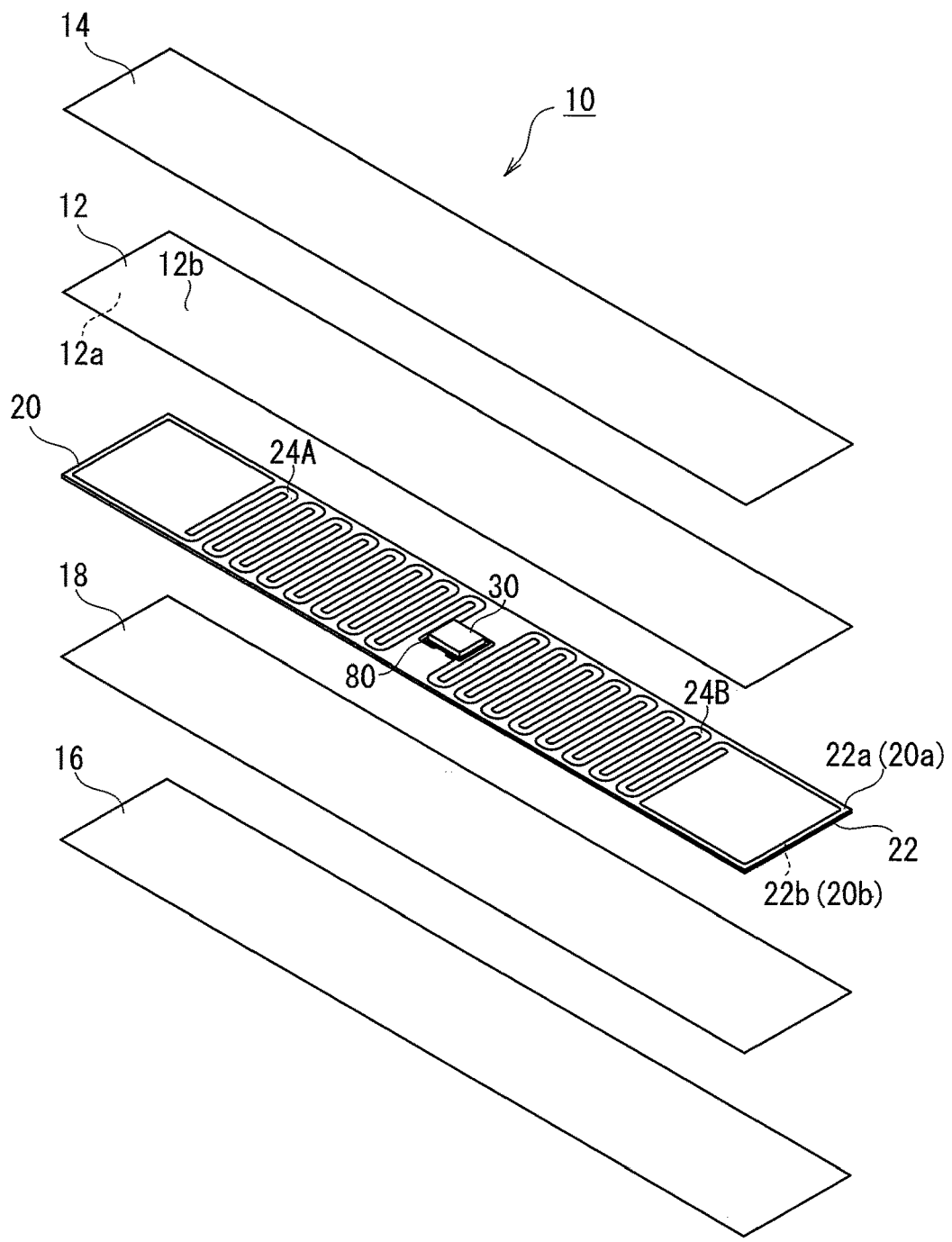
FIG. 2 is an exploded perspective view of the wireless communication device according to the exemplary aspect.

FIG. 1 is a perspective view of a wireless communication device manufactured by a wireless communication device manufacturing apparatus according to an embodiment of the present invention, and FIG. 2 is an exploded perspective view of the wireless communication device. In the figures, an XYZ coordinate system is for facilitating the understanding of the invention and does not limit the invention. For example, an X-axis direction indicates a longitudinal direction of the wireless communication device, a Y-axis direction indicates a width direction, and a Z-axis direction indicates a thickness direction.

As shown in FIG. 1, a wireless communication device 10 has a strip shape and is used as a so-called RFID (Radio-Frequency IDentification) tag.

Specifically, as shown in FIG. 2, the wireless communication device 10 has an antenna member 20 and an RFIC (Radio-Frequency Integrated Circuit) module 30 disposed on the antenna member 20. Further, the wireless communication device 10 has a double-sided tape 12, a mount 14, a print label 16, and a sticking agent 18 as components for use as the RFID tag. As used herein, the term "sticking" means "pressure sensitive adhesion".

In the exemplary aspect, the double-sided tape 12 is a tape having a flexibility and includes sticking surfaces 12a and 12b facing each other in the thickness direction (e.g., Z-axis direction). The sticking surface 12a on one hand is attached to the entirety of a first main surface 20a of the antenna member 20 having the RFIC module 30 disposed thereon. As a result, the double-sided tape 12 functions as a cover member that protects the first main surface 20a of the antenna member 20, i.e., that covers and protects the RFIC module 30. Further, the sticking surface 12b on the other is used when the wireless communication device 10 is attached to an article, and when not in use, it is covered and protected by the mount 14.

On the print label 16 there is printed for example information (e.g., an article name or a barcode) of the article to which the wireless communication device 10 is attached as the RFID tag. For example, the information is printed on the print label 16 by a printer. The print label 16 is attached to a second main surface 20b of the antenna member 20 via the sticking agent 18.

Figure 3:
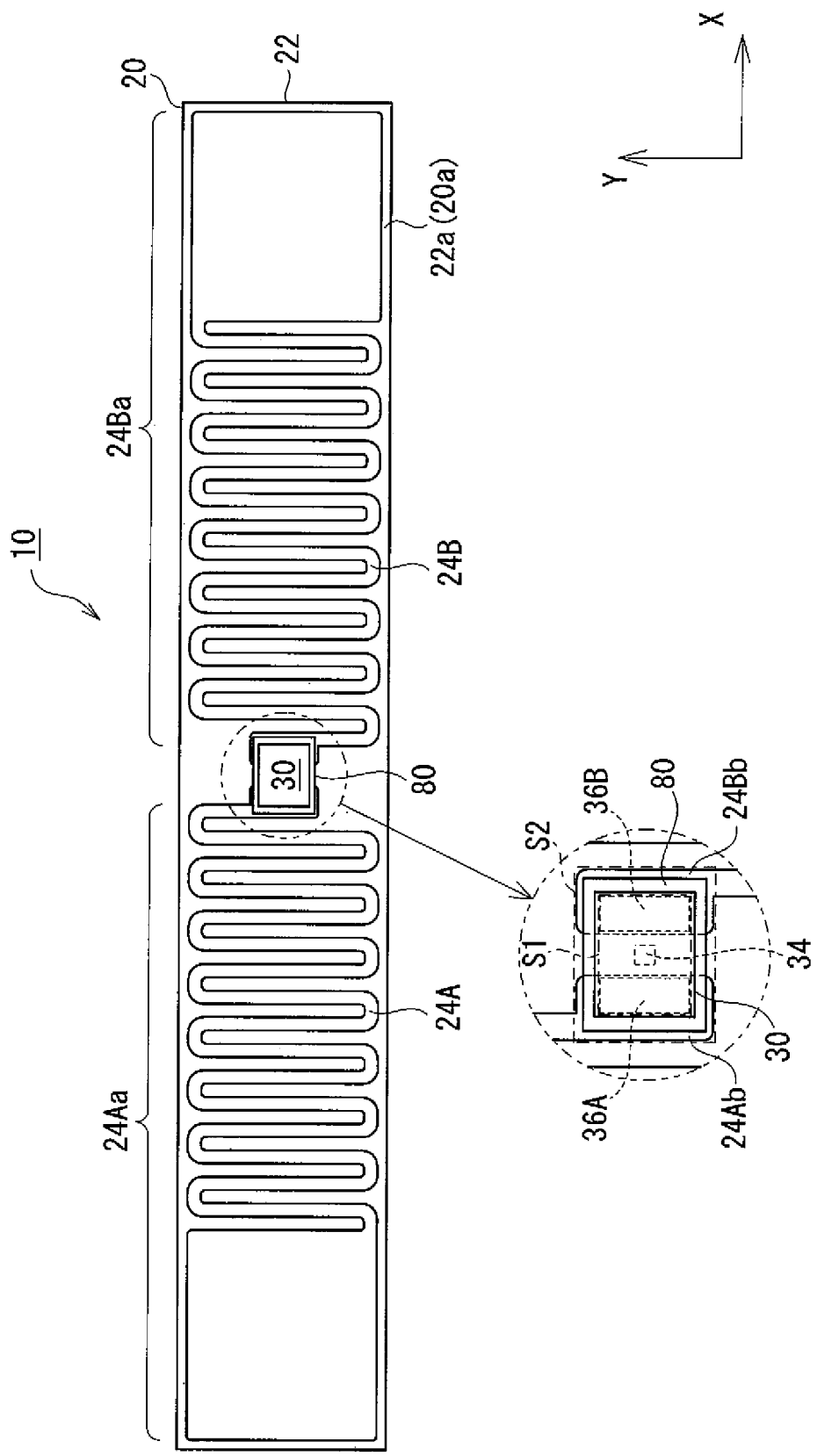
FIG. 3 is a top view of the wireless communication device according to the exemplary aspect.

FIG. 3 is a top view of the wireless communication device 10.

As shown in FIG. 3, the antenna member 20 of the wireless communication device 10 has a strip shape (e.g., elongated rectangular shape) and includes an antenna base material 22 and antenna patterns 24A and 24B disposed on a surface 22a on one hand of the antenna base material 22 (e.g., the first main surface 20a of the antenna member 20).

According to the exemplary aspect, the antenna base material 22 is a flexible sheet-like member made from an insulating material such as a polyimide resin. Further, as shown in FIGS. 2 and 3, the antenna base material 22 includes the surface 22a and a surface 22b that function as the first main surface 20a and the second main surface 20b of the antenna member 20. Since the antenna base material 22 as a main component of the antenna member 20 has a flexibility, the antenna member 20 can also have a flexibility.

The antenna patterns 24A and 24B are used as antennas for the wireless communication device 10 to make wireless communication with an external communication device (e.g., a reader/writer in the case where the wireless communication device 10 is used as the RFID tag). In the present embodiment, the antenna patterns 24A and 24B are for example conductor patterns made from a metal leaf of silver, copper, aluminum, or the like.

Further, the antenna patterns 24A and 25B include radiating portions 24Aa and 24Ba for transmitting and receiving radio waves and coupling portions 24Ab and 24Bb (i.e., the first and second coupling portions) for electrical connection to the RFIC module 30.

In the case of the present embodiment, the radiating portions 24Aa and 24Ba of the antenna patterns 24A and 24B are dipole antennas and have a meander shape. Further, the radiating portions 24Aa and 24Ba each extend from the coupling portions 24Ab and 24Bb disposed at a central portion in the longitudinal direction (e.g., X-axis direction) of the antenna base material 22 toward both ends of the antenna base material 22.

Although the details will be described later, the coupling portions 24Ab and 24Bb of the antenna patterns 24A and 24B electrically connect to terminal electrodes of the RFIC module 30. The coupling portions 24Ab and 24Bb are each a rectangular land.

Figure 4:
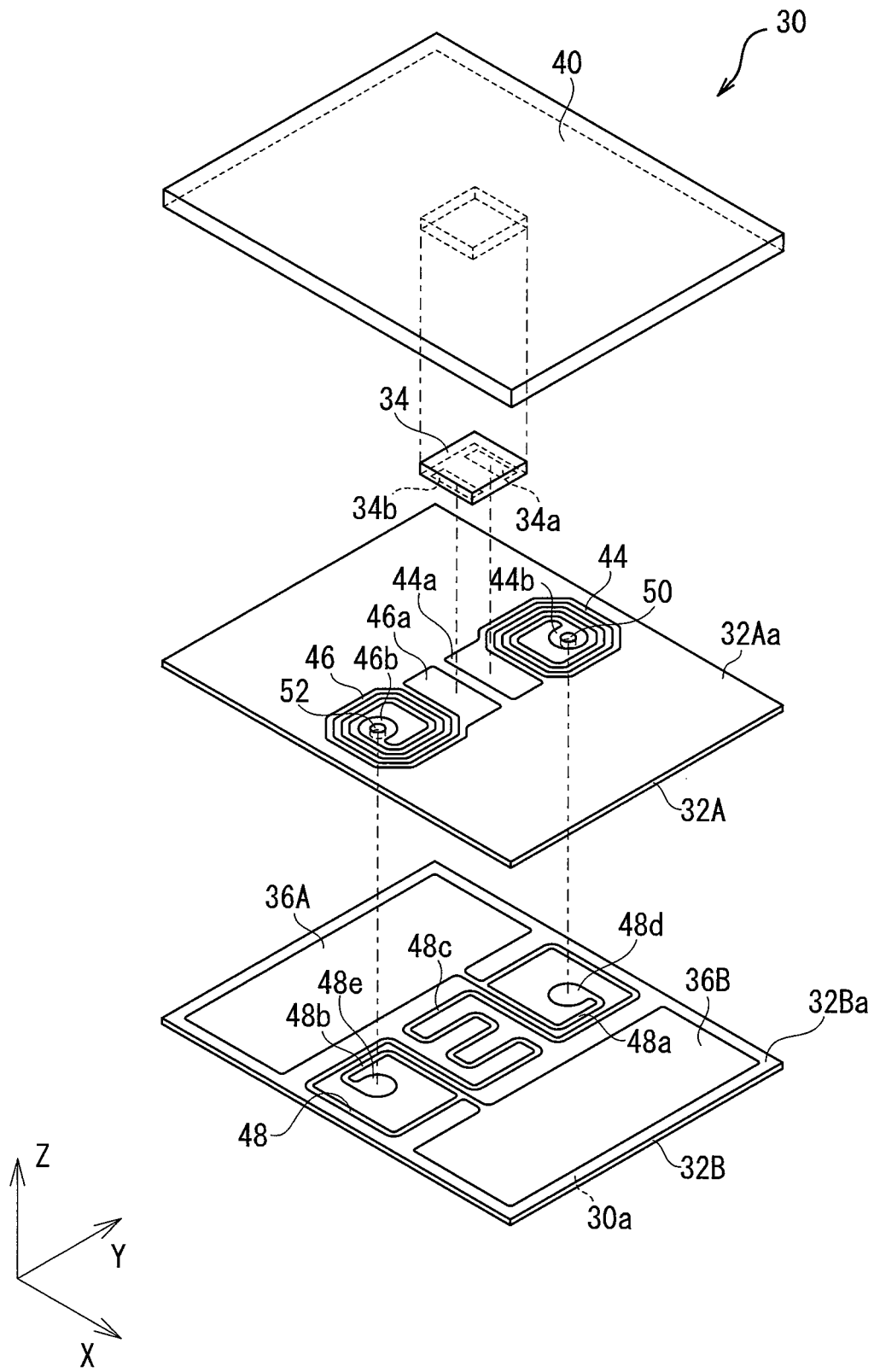
FIG. 4 is an exploded perspective view of an RFIC module according to the exemplary aspect.
Figure 5:
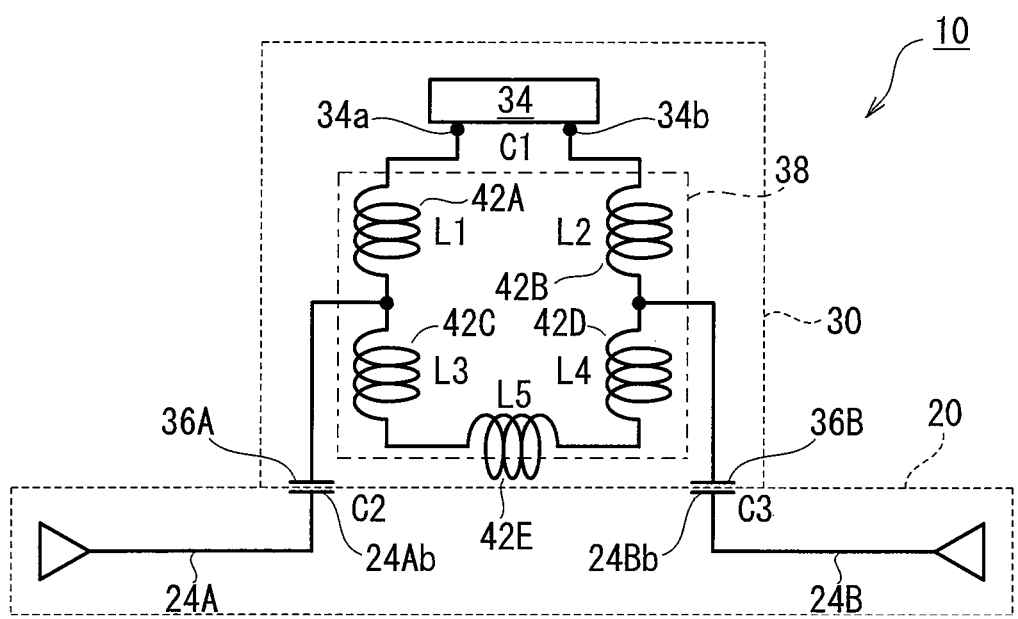
FIG. 5 is an equivalent circuit diagram of the wireless communication device according to the exemplary aspect.

FIG. 4 is an exploded perspective view of the RFIC module 30. FIG. 5 is an equivalent circuit diagram of the wireless communication device.

As shown in FIGS. 4 and 5, the RFIC module 30 is a device that performs wireless communication via the antenna patterns 24A and 24B at a communication frequency in, for example, a 900 MHz band, i.e. a UHF band.

As shown in FIG. 4, in the present embodiment, the RFIC module 30 is a multilayer structure. Specifically, the RFIC module 30 includes, as a module base material that is a main component, two thin plate-shaped insulating sheets 32A and 32B made from an insulating material and laminated. Moreover, each of the insulating sheets 32A to and 32B is a flexible sheet made from an insulating material such as polyimide or liquid crystal polymer.

As further shown in FIGS. 4 and 5, the RFIC module 30 includes an RFIC chip 34 and terminal electrodes 36A and 36B (i.e., first and second terminal electrodes) connected to the RFIC chip 34. Further, the RFIC module 30 includes a matching circuit 38 disposed between the RFIC chip 34 and the terminal electrodes 36A and 36B. A laminate composed of the insulating sheets 32A and 32B as the module base material has larger planar dimensions than the RFIC chip 34. More specifically, in a plan view of the main surface of the module base material on which the RFIC chip 34 is disposed, the external dimensions of the module base material are larger than the external dimensions of the RFIC chip 34 (i.e., the dimensional relationship is such that RFIC chip 34 can be included within the contour of the module base material).

The RFIC chip 34 is a chip driven by the UHF-band frequency (e.g., communication frequency) and has a structure with various elements built in a semiconductor substrate made of semiconductor such as silicon. Further, the RFIC chip 34 includes a first input/output terminal 34a and a second input/output terminal 34b. Furthermore, as shown in FIG. 5, the RFIC chip 34 has an internal capacitance (capacitance: self-capacitance of the RFIC chip itself) C1. Here, the areas of the terminal electrodes 36A and 36B are larger than the areas of the first input/output terminal 34a and the second input/output terminal 34b. As a result, the productivity of the wireless communication device 10 is improved. The reason is that registering the RFIC module 30 on the antenna patterns 24A and 24B is easier than registering the first and second input/output terminals 34a and 34b of the RFIC chip 34 directly on the coupling portions 24Ab and 24Bb of the antenna patterns 24A and 24B.

Further, as shown in FIG. 4, the RFIC chip 34 is built (or otherwise formed) in the RFIC module 30 that is a multilayer structure. Specifically, the RFIC chip 34 is sealed in a resin package 40 arranged and formed on the insulating sheet 32A. The resin package 40 is made from an elastomer resin such as polyurethane or a hot melt resin. The RFIC chip 34 is protected by this resin package 40. Further, the resin package 40 improves the flexural rigidity of the RFIC module 30 having a multilayer structure composed of the flexible insulating sheets 32A and 32B. As a result, the RFIC module 30 with the built-in RFIC chip 34 can be handled like electronic parts by a parts feeding device such as a parts feeder (the RFIC chip 34 alone cannot be handled by the parts feeder or the like due to a risk of breakage such as chipping).

In the exemplary aspect, the terminal electrodes 36A and 36B are conductor patterns made from a conductor material such as silver, copper or aluminum and are disposed on an inner surface 32Ba of the insulating sheet 32B forming a first main surface 30a of the RFIC module 30 (e.g., a surface opposite to the first main surface 30a and facing the insulating sheet 32A). That is, in the case of the present embodiment, the terminal electrodes 36A and 36B are built in without being exposed to the outside. Further, the terminal electrodes 36A and 36B are rectangular in shape in the exemplary aspect. Note that, although described later, these terminal electrodes 36A and 36B are electrodes for electrically connecting to the coupling portions 24Ab and 24Bb of the antenna patterns 24A and 24.

As shown in FIG. 5, the matching circuit 38 disposed between the RFIC chip 34 and the terminal electrodes 36A and 36 is composed of a plurality of inductance elements 42A to 42E.

Each of the plurality of inductance elements 42A to 42E is composed of a conductor pattern disposed on each of the insulating sheets 32A and 32B.

Conductor patterns 44 and 46 made from a conductor material such as silver, copper or aluminum are disposed on an outer surface 32Aa (e.g., a surface on which the resin package 40 is disposed) of the insulating sheet 32A of the RFIC module 30. The conductor patterns 44 and 46 are each a spiral coil-shaped pattern and include, at their respective outer peripheral ends, land portions 44a and 46a, respectively, for electrically connecting to the RFIC chip 34. Note that the land portion 44a and the first input/output terminal 34a of the RFIC chip 34 are electrically connected to each other via, for example, solder or a conductive adhesive. Similarly, the land portion 46a and the second input/output terminal 34b are also electrically connected to each other.

As shown in FIG. 5, the spiral coil-shaped conductor pattern 44 on one hand on the insulating sheet 32A constitutes the inductance element 42A having an inductance L1. Further, the spiral coil-shaped conductor pattern 46 on the other constitutes the inductance element 42B having an inductance L2.

A conductor pattern 48 made from a conductor material such as silver, copper, or aluminum is disposed on the insulating sheet 32B adjacent to the insulating sheet 32A. The conductor pattern 48 includes the terminal electrodes 36A and 36B, spiral coil portions 48a and 48b, and a meander portion 48c. On the insulating sheet 32B, the spiral coil portions 48a and 48b and the meander portion 48c are arranged between the terminal electrodes 36A and 36B.

The spiral coil portions 48a on one hand of the conductor pattern 48 on the insulating sheet 32B is electrically connected to the terminal electrode 36A. Further, a central end 48d of the spiral coil portion 48a is electrically connected, through an interlayer connecting conductor 50 such as a through-hole conductor formed on the insulating sheet 32A, to a central end 44b of the spiral coil-shaped conductor pattern 44 on the insulating sheet 32A. Further, the spiral coil portion 48a is configured so that current flowing through the conductor pattern 44 and current flowing through the spiral coil portion 48a have the same circulation direction. Further, as shown in FIG. 5, the spiral coil portion 48a constitutes the inductance element 42C having an inductance L3.

The spiral coil portions 48b on the other of the conductor pattern 48 on the insulating sheet 32B is electrically connected to the terminal electrode 36B. Further, a central end 48e of the spiral coil portion 48b is electrically connected, through an interlayer connecting conductor 52, such as a through-hole conductor formed on the insulating sheet 32A, to a central end 46b of the spiral coil-shaped conductor pattern 46 on the insulating sheet 32A. Further, the spiral coil portion 48b is configured so that current flowing through the conductor pattern 46 and current flowing through the spiral coil portion 48b have the same circulation direction. Furthermore, as shown in FIG. 5, the spiral coil portion 48b constitutes the inductance element 42D having an inductance L4.

The meander portion 48c of the conductor pattern 48 on the insulating sheet 32B electrically connects an outer peripheral end of the spiral coil portion 48a on one hand and an outer peripheral end of the spiral coil portion 48b on the other. Further, as shown in FIG. 5, the meander portion 48c constitutes the inductance element 42E having an inductance L5.

The impedances between the RFIC chip 34 and the terminal electrodes 36A and 36B are matched at a predetermined frequency (e.g., communication frequency) by the matching circuit 38 including such inductance elements 42A to 42E (and also including the self-capacitance C1 of the RFIC chip 34).

According to such a wireless communication device 10, when the antenna patterns 24A and 24B receive a radio wave (e.g., a signal) of a predetermined UHF-band frequency (e.g., communication frequency), a current corresponding to the signal flows from the antenna patterns 24A and 24B to the RFIC chip 34. When supplied with the current, the RFIC chip 34 is driven to output a current (e.g., a signal) corresponding to information stored in its internal storage unit (not shown) to the antenna patterns 24A and 24B. Then, a radio wave corresponding to the current is radiated from the antenna patterns 24A and 24B.

The configurations of the antenna member 20 and the RFIC module 30 in the wireless communication device 10 have been described so far. The mechanical and electrical connections between them will now be described.

Figure 6:
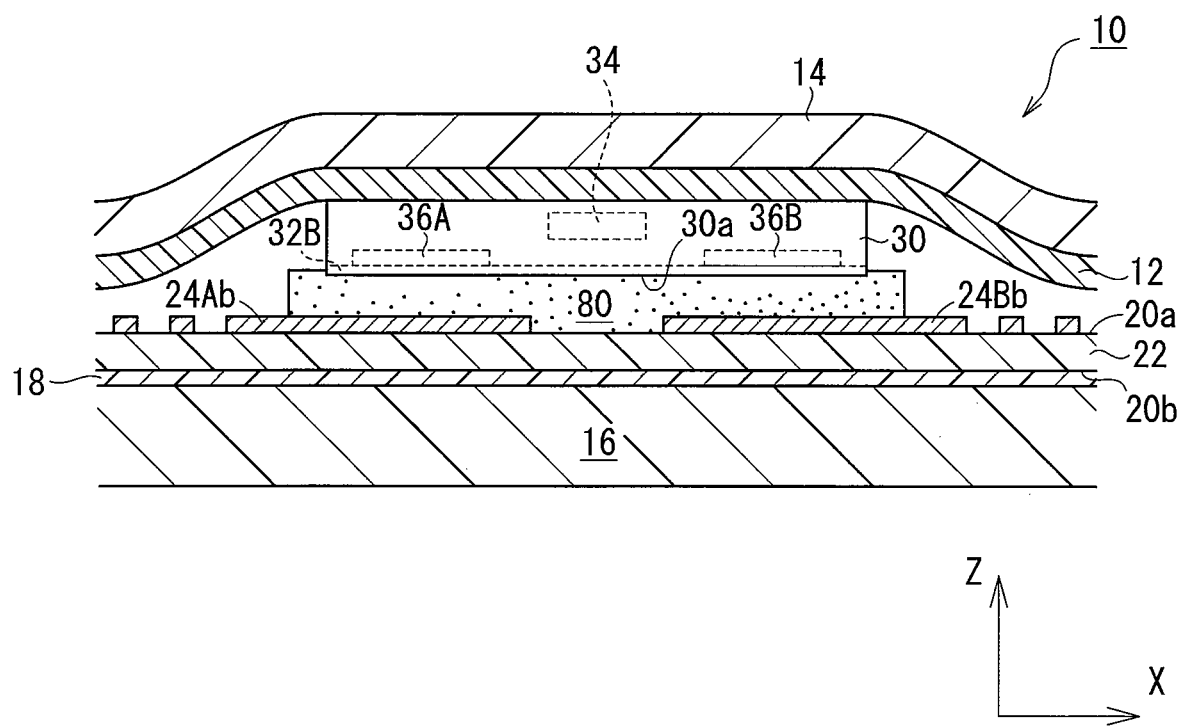
FIG. 6 is a partial cross-sectional view of the wireless communication device according to the exemplary aspect.

FIG. 6 is a partial cross-sectional view of the wireless communication device.

As shown in FIG. 6, in the case of the present embodiment, an insulating sticky layer 80 as an adhesive member is disposed between the first main surface 20a of the antenna member 20 having the antenna patterns 24A and 24B disposed thereon and the first main surface 30a of the RFIC module 30.

In the exemplary aspect, the sticky layer 80 is a thin film of an insulating sticking agent. Further, the sticky layer 80 is made from, for example, a rubber-based, acrylic-based, silicon-based, or urethane-based sticking agent and has elasticity.

The "sticky layer" will be described. In general, the "sticky layer" is one type of an "adhesive member" and is a layer intervening between two objects to bond the two objects together. As used herein, the "sticky layer" means a "pressure sensitive adhesive member" and is definitely distinguished from an "other adhesive member".

As used herein, the "sticky layer" is a solid that is substantially elastic or a liquid that is substantially viscous when it is sandwiched between two objects to bond them together. The "sticky layer" basically does not undergo a phase change immediately before and immediately after the two objects are bonded together. Note that the "sticky layer" may contain a solvent to facilitate application to the surface of an object (to increase fluidity). In this case, the two objects are bonded after the application to the surface of the object is completed and the solvent is sufficiently volatilized.

Further, the "sticky layer" adheres to the object when the object is pressed against it. Therefore, although the "sticky layer" has a low adhesive force, it is possible to separate the object from the "sticky layer" in a non-destructive manner. Note that a sticking force is measured by the test method specified in IEC60454-2, for example.

In contrast to the "sticky layer", the "other adhesive member" is generally a hard solid with substantially no elasticity when sandwiched by two objects to bond them together. Accordingly, the "other adhesive member" is usually a liquid before bonding and only adheres to the object when it solidifies. The "other adhesive member" is, for example, a layer of an epoxy-based thermosetting adhesive that solidifies by heat. Further, for example, the "other adhesive member" also includes a photosetting resin that sets when exposed to light. Furthermore, in a broad sense, solder is also included in the "other adhesive member". In the case of the "other adhesive member", due to a larger adhesive force than the sticky layer, it is less likely to separate from the object, with the result that if it is forcibly separated, the adhesive surface of the object may be partially destroyed.

When comparing the "sticky layer" and the "other adhesive member", when two objects in the bonded state are deformed, for example, by bending, the "other adhesive member" is more easily destroyed than the "sticky layer". This is because the "other adhesive member" is harder and has a higher deformation resistance than the "sticky layer". On the other hand, since the "sticky layer" has a lower deformation resistance than the "other adhesive member", it deforms itself depending on the deformation of the object, to thereby relieve the stress concentration and prevent the destruction of itself.

Via the sticky layer 80 having such characteristics, the RFIC module 30 is adhered to the antenna member 20.

Specifically, as shown in FIG. 6, the sticky layer 80 is sandwiched between and bonds together the coupling portions 24Ab and 24Bb in the antenna patterns 24A and 24B of the antenna member 20 and the terminal electrodes 36A and 36B of the RFIC module 30. As a result, the coupling portion 24Ab and the terminal electrode 36A are capacitively coupled via the sticky layer 80 and the insulating sheet 32B (a capacitance C2 is formed as shown in FIG. 5). Similarly, the coupling portion 24Bb and the terminal electrode 36B are capacitively coupled via the sticky layer 80 and the insulating sheet 32B (a capacitance C3 is formed). Due to such bonding, the terminal electrodes 36A and 36B and the coupling portions 24Ab and 24Bb do not come into direct contact with each other. Further, by such capacitive coupling, the RFIC chip 34 in the RFIC module 30 can perform wireless communication via the antenna patterns 24A and 24B.

Note that due to the capacitive coupling via the sticky layer 80, the distances between the coupling portions 24Ab and 24Bb and the terminal electrodes 36A and 36B may vary, that is, the capacitances C2 and C3 may vary. However, as shown in FIG. 5, since the matching circuit 38 matches the RFIC chip 34 and the terminal electrodes 36A and 36B at a predetermined resonance frequency (e.g., communication frequency), even if the capacitances C2 and C3 vary, the communication characteristics (for example, communication distance) of the wireless communication device 10 are not substantially affected.

Description will next be given of a method of adhering the RFIC module 30 to the antenna member 20 via such a sticky layer 80.

Figure 7:
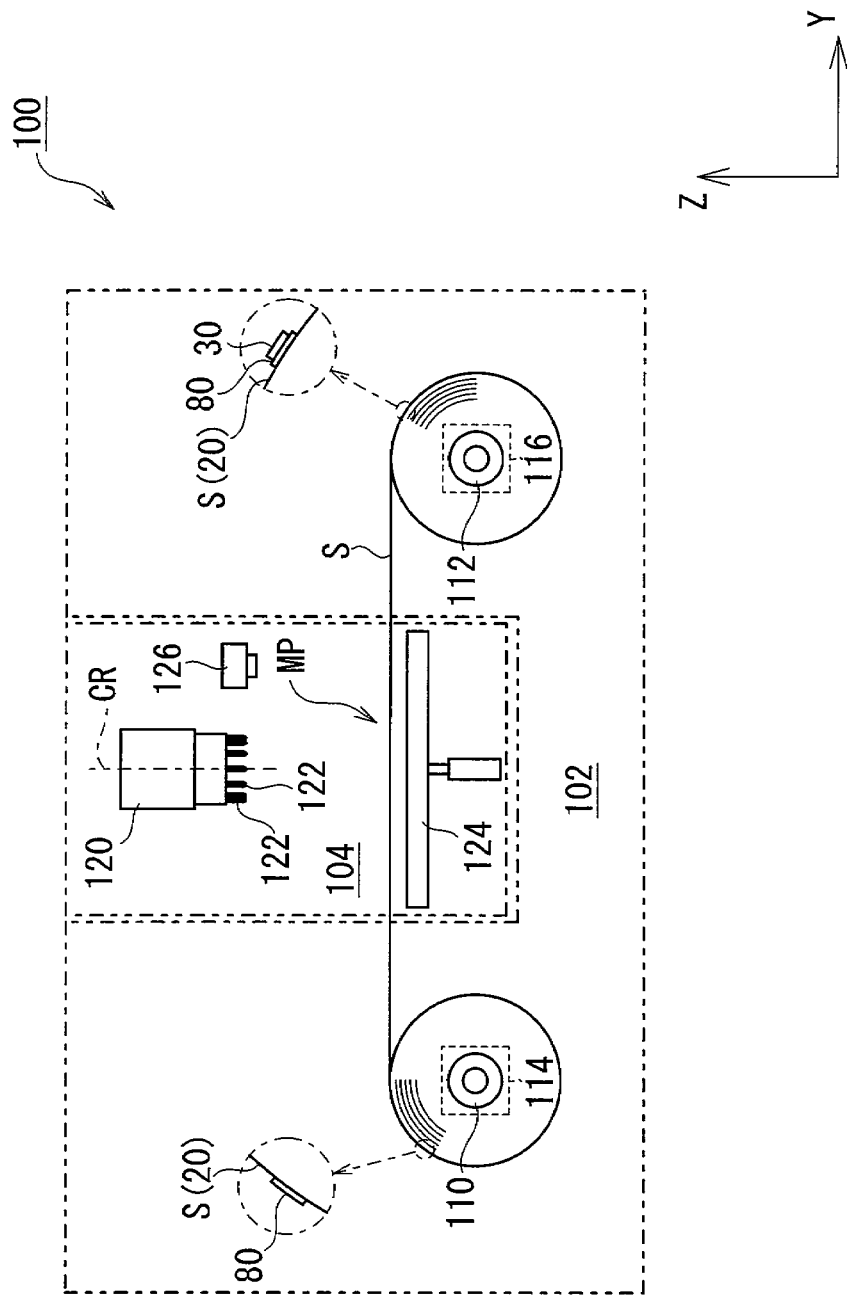
FIG. 7 is a schematic configuration diagram of a wireless communication device manufacturing apparatus according to an exemplary embodiment.

FIG. 7 is a schematic configuration diagram of a wireless communication device manufacturing apparatus according to an exemplary embodiment.

As shown, a wireless communication device manufacturing apparatus 100 shown in FIG. 7 is configured so that the RFIC module 30 is mounted on the antenna member 20, specifically, so that the RFIC module 30 is affixed via the sticky layer 80 to the antenna member 20.

As shown in FIG. 7, the wireless communication device manufacturing apparatus 100 includes a transport unit 102 that transports an elongated material sheet S in the longitudinal direction thereof, the material sheet S being divided in a subsequent process into a plurality of pieces to be processed into the antenna members 20; and a mounting unit (e.g., a mounting device) 104 that is configured to mount the RFIC module 30 on the material sheet S.

Figure 8:
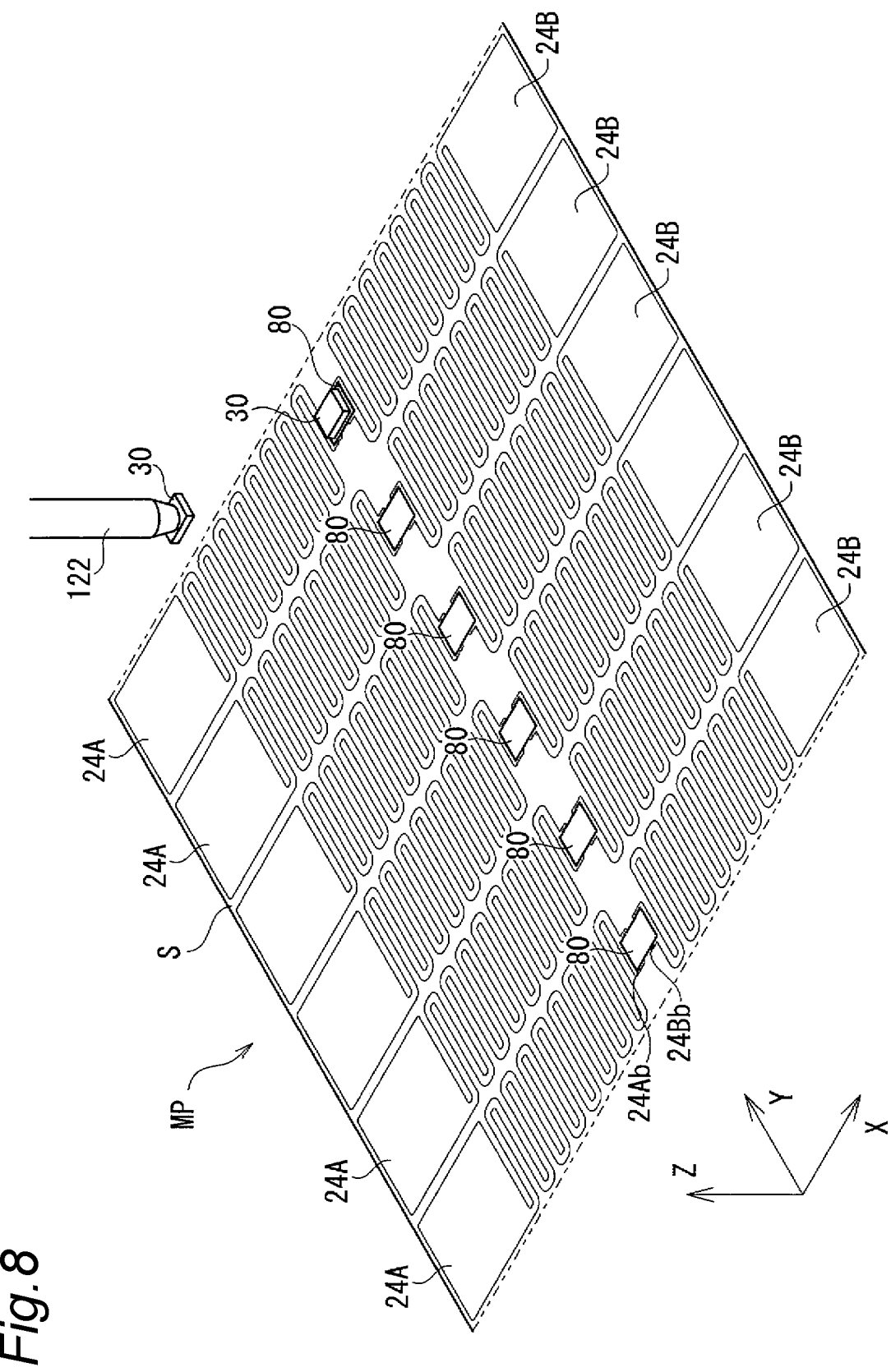
FIG. 8 is a perspective view of a material sheet on which the RFIC module is being mounted.

FIG. 8 is a perspective view of the material sheet on which the RFIC module is being mounted.

As shown in FIG. 8, the material sheet S is formed with the antenna patterns 24A and 24B of a plurality of antenna members 20. Note in the present embodiment that the plurality of antenna patterns 24A and 24B are formed such that the longitudinal direction (e.g., X-axis direction) of the antenna member 20 divided in the subsequent process coincides with the width direction (i.e., a direction orthogonal to the transport direction) of the material sheet S.

Further, as shown in FIG. 8, the material sheet S is disposed with a plurality of sticky layers 80, previous to mounting the RFIC modules 30. That is, the RFIC module 30 is not disposed with the sticky layers 80. The transport unit 102 in the wireless communication device manufacturing apparatus 100 is configured to transport the material sheet S with such sticky layers 80. Note that the sticky layers 80 are formed by screen-printing (e.g., applying) the sticking agent onto the material sheet S, for example, by using a screen printing machine.

To that end, in the case of the present embodiment, as shown in FIG. 7, the transport unit 102 includes a feed reel 110 for winding the material sheet S; and a recovery reel 112 for winding and recovering the material sheet S after the RFIC module 30 is mounted. The transport unit 102 further includes motors 114 and 116 that rotationally drive the feed reel 110 and the recovery reel 112.

In the case of the present embodiment, around the feed reel 110 there is wound the elongated material sheet S on which as shown in FIG. 8, the plurality of antenna patterns 24A and 24B are formed, with the sticky layer 80 being disposed on the coupling portions 24Ab and 24Bb in the antenna patterns 24A and 24B, respectively. Note in the case of the present embodiment that the material sheet S is wound around the feed reel 110 such that the sticky layer 80 lies on the outer peripheral side with respect to the material sheet S.

The feed reel 110 is rotationally driven by the motor 114. The material sheet S is thereby sent out from the feed reel 110. The drive timing of the motor 114 will be described later.

The transport unit 102 is configured to transport the material sheet S pulled out from the feed reel 110 toward a mounting position MP. In the case of the present embodiment, the mounting position MP is disposed between the feed reel 110 and the recovery reel 112.

The mounting unit 104 mounts the RFIC modules 30 on a portion of the material sheet S that lies at the mounting position MP.

In an exemplary aspect, the mounting unit 104 is a so-called pick-and-place type parts mounting device and includes a mounting head 120 that picks up the RFIC modules 30 at a pickup position and places (i.e., mounts) the picked-up RFIC modules 30 on the portion of the material sheet S lying at the mounting position MP.

Figure 9:
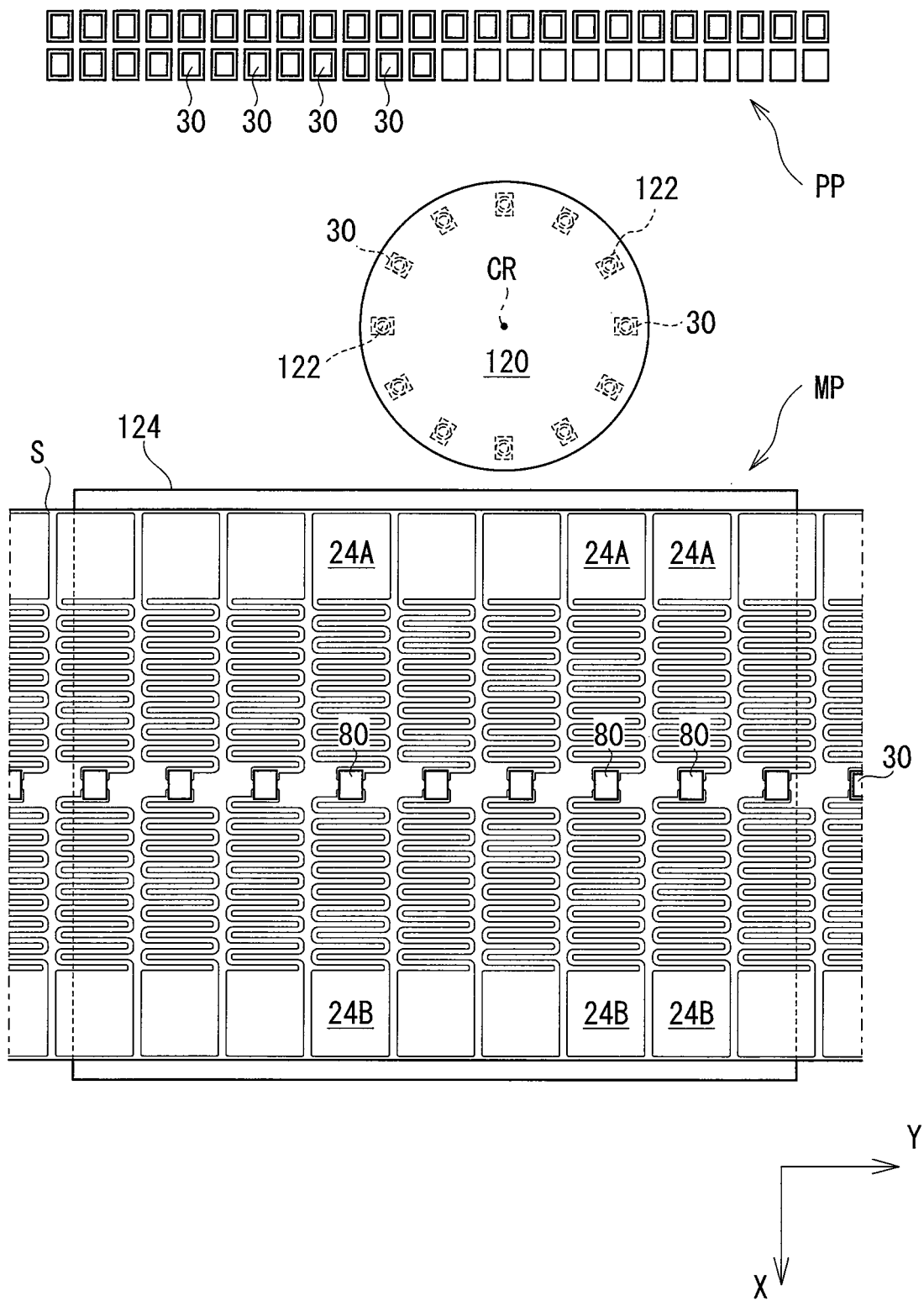
FIG. 9 is a diagram showing a mounting head that is moving from a pickup position toward a mounting position.

FIG. 9 is a diagram showing the mounting head moving from the pickup position toward the mounting position.

As shown in FIG. 9, in the case of the present embodiment, the mounting head 120 is configured to be movable between a pickup position PP where a plurality of RFIC modules 30 stand by and the mounting position MP where the RFIC modules 30 are mounted on the material sheet S. Specifically, the mounting head 120 is configured to be movable in the horizontal direction (i.e., the X-axis direction and Y-axis direction) and the vertical direction (i.e., the Z-axis direction).

Further, the mounting head 120 includes a plurality of nozzles 122 each attracting and holding the RFIC module 30. In the case of the present embodiment, the mounting head 120 includes 12 nozzles 122. As shown in FIG. 8, each nozzle 122 attracts and holds the RFIC module 30 at its tip. Further, to pick up the RFIC module 30 at the pickup position PP and to mount the RFIC module 30 on the material sheet S at the mounting position MP, each nozzle 122 is disposed on the mounting head 120 so as to be movable in the vertical direction (i.e., the Z-axis direction).

Furthermore, as shown in FIG. 9, the mounting head 120 is a so-called rotary head and is configured so that 12 nozzles 122 orbit around the rotation center line CR extending in the vertical direction (i.e., the Z-axis direction). This configuration enables 12 RFIC modules 30 to be picked up in a short time by the 12 nozzles 122.

As shown in FIG. 7, in the case of the present embodiment, the mounting unit 104 has a suction type elevating stage 124 for fixing the material sheet S at the mounting position MP. The elevating stage 124 rises immediately before the mounting head 120 starts mounting the plurality of RFIC modules 30 onto the material sheet S, to come into contact with the material sheet S. A large number of suction holes (not shown) are formed on a contact surface of the elevating stage 124 that comes into contact with the material sheet S. When a pump (not shown) sucks the material sheet S in contact with the contact surface via the large number of suction holes, the material sheet S is attracted to the elevating stage 124, i.e., is fixed at the mounting position MP. With such an elevating stage 124, the mounting head 120 can mount the RFIC modules 30 on the material sheet S fixed. When the mounting of the plurality of RFIC modules 30 is completed, the elevating stage 124 finishes sucking the material sheet S and descends away from the material sheet S.

Moreover, as further shown in FIG. 7, the mounting unit 104 has an imaging camera 126 that captures a portion of the material sheet S that is fixed to the elevating stage 124. By image processing, the mounting unit 104 extracts an image of an alignment marker on the material sheet S from an image captured by the imaging camera 126 and identifies the position and orientation of the image of the alignment marker in the captured image. Further, the mounting unit 104 identifies the position and orientation of the material sheet S fixed to the elevating stage 124, based on the position and shooting direction of the imaging camera 126 known in advance and the identified position and orientation of the image of the alignment marker in the captured image. The mounting unit 104 then positions the mounting head 120, based on the identified position and orientation of the material sheet S. Note that it is also possible to use the antenna patterns 24A and 24B as alignment markers.

By the elevating stage 124 that fixes the material sheet S at the mounting position MP and by the imaging camera 126 for identifying the position and orientation of the fixed material sheet S, the mounting head 120 can accurately mount the RFIC module 30 on the sticky layer 80 on the material sheet S. That is, as shown in FIG. 6, the RFIC module 30 can be mounted on the sticky layer 80 such that the coupling portion 24Ab of the antenna pattern 24A and the terminal electrode 36A face each other with the sticky layer 80 in between and such that the coupling portion 24Bb of the antenna pattern 24B and the terminal electrode 36B face each other with the sticky layer 80 in between.

Although described in more detail below, it is generally noted that the RFIC module 30 is temporarily adhered to the sticky layer 80 by the mounting unit 104. That is, to the extent that the RFIC module 30 does not fall off from the sticky layer 80 while a portion of the material sheet S mounted with the RFIC modules 30 is moving from the mounting position MP to the recovery reel 112, the RFIC module 30 is temporarily adhered to the sticky layer 80 with a pressing force of 50 g of the nozzle 122, for example.

As shown in FIG. 7, the transport unit 102 is configured to transport the portion of the material sheet S that has been mounted with the RFIC modules 30 at the mounting position MP, toward the recovery reel 112.

The recovery reel 112 is rotationally driven by the motor 116, to thereby wind up and recover the portion of the material sheet S mounted with the RFIC modules 30. The RFIC module 30 is truly adhered to the sticky layer 80 by winding on the recovery reel 112.

Figure 10:
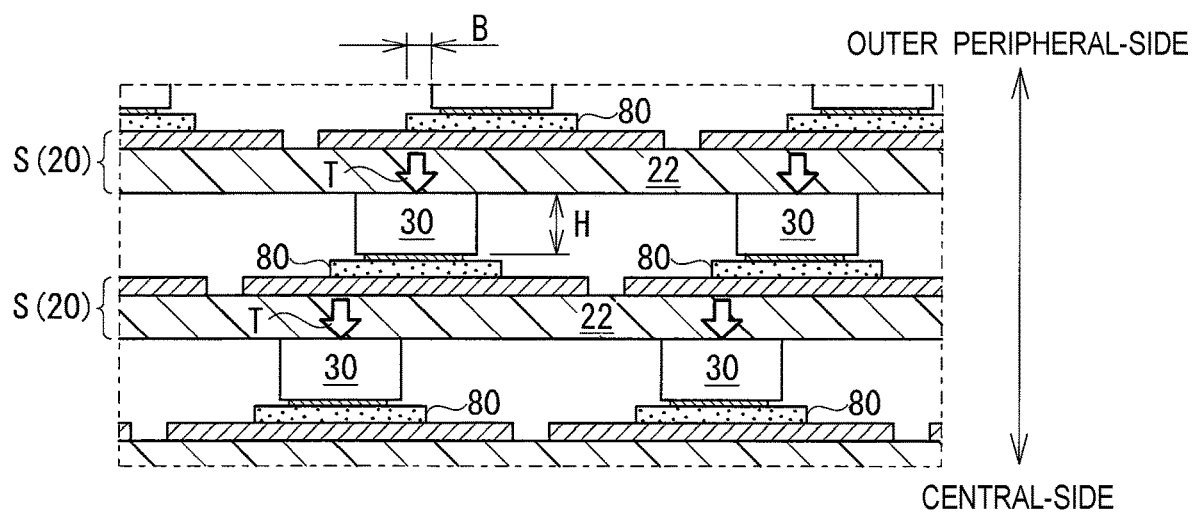
FIG. 10 is a diagram showing the RFIC module and a sticky layer on the material sheet wound and recovered on a recovery reel.

FIG. 10 shows the RFIC module and the sticky layer on the material sheet wound and recovered on the recovery reel.

As shown in FIG. 10, the portion of the material sheet S mounted with the RFIC modules 30 is subjected to a tightening force T from another portion of the material sheet S that lies on the outer peripheral side thereof. This tightening force T acts on the RFIC module 30, to urge the RFIC module 30 toward the sticky layer 80. As a result, air is released from between the RFIC module 30 and the sticky layer 80 over time, and the RFIC module 30 is truly adhered to the sticky layer 80 so that they are in close contact with each other without gaps.

On the recovery reel 112, the sticky layer 80 and a portion of the material sheet S facing the sticky layer 80 with the RFIC module 30 in between (e.g., a portion of the material sheet S lying on the outer peripheral side with respect to the sticky layer 80) do not come into contact with each other due to the presence of the RFIC module 30 therebetween. As shown in FIG. 10, however, when a protrusion amount B of the sticky layer 80 protruding from the RFIC module 30 in the winding direction of the material sheet S is excessively large, the sticky layer 80 may adhere to the portion of the material sheet S that lies on the outer peripheral side thereof.

In order to prevent the sticky layer 80 from adhering to the portion of the material sheet S lying on the outer peripheral side thereof, the protrusion amount B of the sticky layer 80 may be a value that satisfies Equation 1.

$$B < \left(R \times \cos^{-1}\left(\frac{R}{R+H}\right)\right) \div 2 \qquad \text{(Eq. 1)}$$

Figure 11:
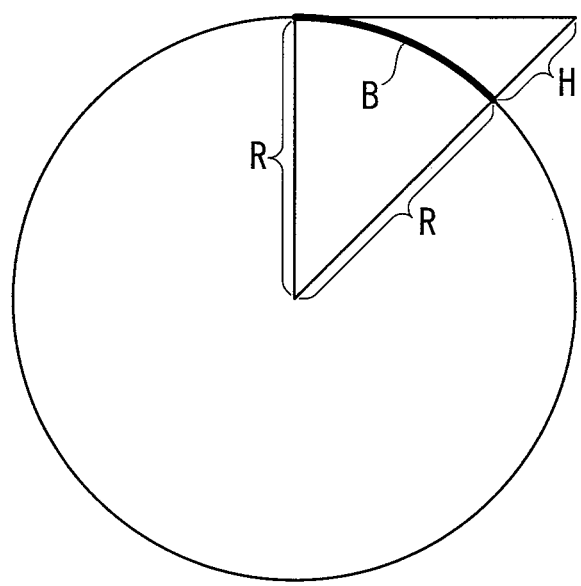
FIG. 11 is a diagram briefly showing a geometrical relationship among a protrusion amount B of the sticky layer, a radius R of a winding shaft of the recovery reel, and a thickness H of the RFIC module.

Here, R is a radius of a winding shaft of the recovery reel 112, and H is a thickness of the RFIC module 30. Note that FIG. 11 is a diagram briefly showing a geometrical relationship among the protrusion amount B of the sticky layer, the radius R of the winding shaft of the recovery reel, and the thickness H of the RFIC module. Equation 1 is derived based on the geometrical relationship shown in FIG. 11, and the protrusion amount B of the sticky layer 80 can be determined from the radius R of the winding shaft of the recovery reel 112 and the thickness H of the RFIC module 30, based on Equation 1. For example, if the radius R is 720 mm and the height H is 230 the protrusion amount B is determined to be smaller than approx. 2000 μm calculated based on Equation 1, for example, to be 450 μm.

Note that the tightening force T of the portion of the material sheet S wound around the recovery reel 112 shown in FIG. 10 is caused also by an elastic force of the material sheet S, i.e., a restoring force with which the portion stretched by winding tries to return to its original state.

Hereinafter, the operation of the wireless communication device manufacturing apparatus 100 will be described. In particular, the operation of the transport unit 102 will be described.

The operation of the transport unit 102 are roughly classified into a first transport operation executed while the mounting head 120 of the mounting unit 104 is mounting the plurality of RFIC modules 30 on the material sheet S and a second transport operation executed while the mounting head 120 of the mounting unit 104 is picking up the plurality of RFIC modules 30.

Figure 12A:
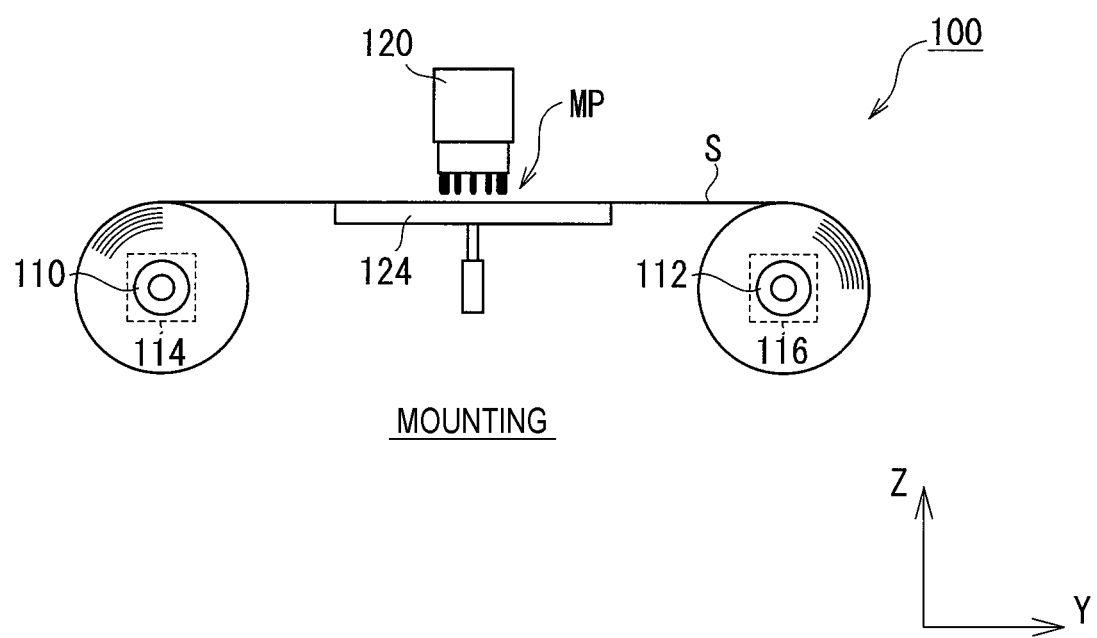
FIG. 12A is a diagram showing a first transport operation executed while a mounting unit is mounting a plurality of RFIC modules on the material sheet.
Figure 12B:
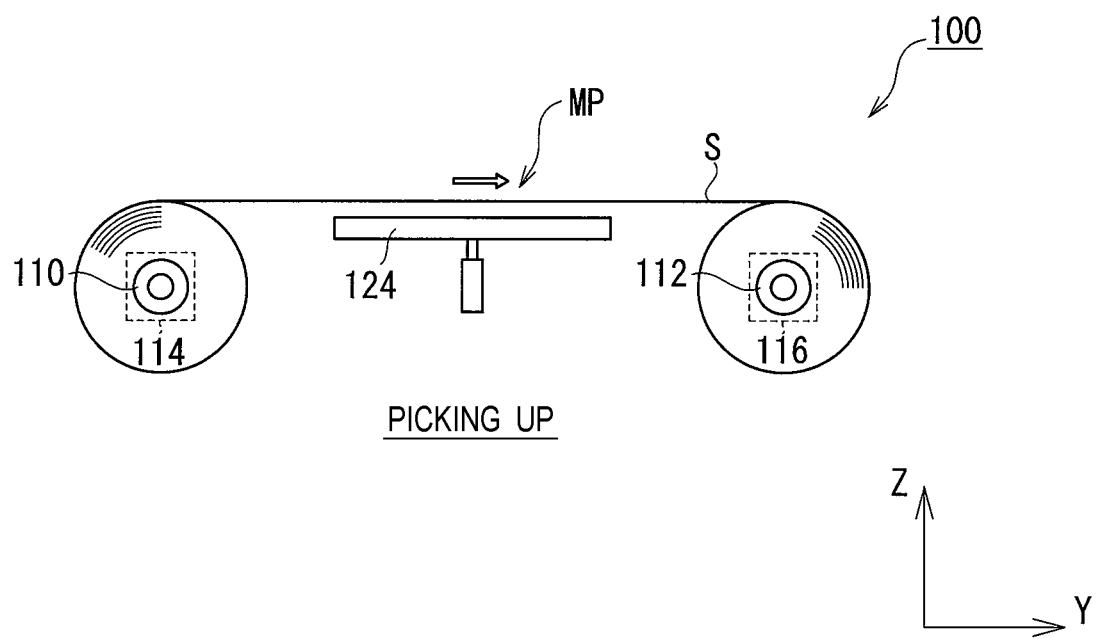
FIG. 12B is a diagram showing a second transport operation executed while the mounting unit is picking up a plurality of RFIC modules.

FIG. 12A is a diagram showing the first transport operation executed while the mounting unit is mounting the plurality of RFIC modules on the material sheet. FIG. 12B is a diagram showing the second transport operation executed while the mounting unit is picking up the plurality of RFIC modules 30.

As shown in FIG. 12A, while at the mounting position MP, the mounting head 120 of the mounting unit 104 is mounting the plurality of RFIC modules 30 on the plurality of sticky layers 80 on the material sheet S, the feed reel 110 and the recovery reel 112 do not rotate (i.e., the motors 114 and 116 are not driven). Further, the portion of the material sheet S lying at the mounting position MP is fixed by the elevating stage 124.

As shown in FIG. 12B, while the mounting head 120 do not perform mounting, that is, while apart from the mounting position MP the mounting head 120 is picking up the plurality of RFIC modules 30 at the pickup position PP, the feed reel 110 and the recovery reel 112 rotate (i.e., the motors 114 and 116 are driven), with the elevating stage 124 being apart from the portion of the material sheet S lying at the mounting position MP. As a result, while the portion of the material sheet S mounted with the RFIC modules 30 is transported toward the recovery reel 112, a portion of the material sheet S to be mounted with the RFIC modules 30 is transported from the feed reel 110 toward the mounting position MP.

By such transport control of the material sheet S shown in FIGS. 12A and 12B, the mounting unit 104 can mount the RFIC modules 30 on the sticky layers 80 on the material sheet S in a short time.

Further, the wireless communication device 10 is configured so that the RFIC modules 30 can be mounted on the sticky layers 80 on the material sheet S in a short time.

First, as shown in FIG. 2, when viewed from the direction (e.g., Z-axis direction) where the RFIC module 30, the sticky layer 80, and the antenna member 20 are stacked, the sizes of the coupling portions 24Ab and 24Bb of the antenna patterns 24A and 24B are respectively larger than the sizes of the corresponding terminal electrodes 36A and 36B of the RFIC module 30. At the same time, the pitch spacing between the terminal electrode 36A and the terminal electrode 36B and the pitch spacing between the coupling portion 24Ab and the coupling portion 24Bb are specified so that when viewed from the stacking direction, the terminal electrode 36A can lie at the center of the coupling portion 24Ab and so that the terminal electrode 36B can lie at the center of the coupling portion 24Bb.

By such a configuration, even if there is some variation at the adhesion position of the RFIC module 30 with respect to the antenna member 20, the terminal electrode 36A and the coupling portion 24Ab can be electrically connected (e.g., capacitively coupled) facing each other and the terminal electrode 36B and the coupling portion 24Bb can be electrically connected (e.g., capacitively coupled) facing each other. In consequence, it is only necessary for the mounting unit 104 to position the nozzles 122 of the mounting head 120 with respect to the material sheet S with a certain degree of accuracy, thereby enabling the mounting head 120 to be moved at a high speed.

Further, since the RFIC module 30 can be positioned on the antenna member 20 with a high accuracy in a short time, the RFIC module 30 can be mounted on the material sheet S (i.e., the antenna member 20) in a short time. For example, before the mounting head 120 starts mounting a plurality of RFIC modules 30, the imaging camera 126 captures all of the plurality of antenna patterns 24A and 24B in the portion of the material sheet S on the elevating stage 124. Next, images of all the coupling portions 24Ab and 24Bb in the captured image of the imaging camera 126 are extracted. At this time, due to the large size of the coupling portions 24Ab and 24Bb, the positions and orientations of images of the coupling portions in the captured image can be identified with a high accuracy. As a result, the terminal electrodes 36A and 36B of the RFIC module 30 can be easily positioned with respect to the coupling portions 24Ab and 24Bb of the antenna patterns 24A and 24B with a high accuracy in a short time.

In contrast to this configuration, if the sizes of the coupling portions 24Ab and 24Bb of the antenna patterns 24A and 24B are equal to or smaller than the sizes of the terminal electrodes 36A and 36B, the nozzles 122 of the mounting head 120 need to be positioned with respect to the material sheet S with a high accuracy. For that reason, the high-speed movement of the mounting head 120 is restrained. Further, in the case where the imaging camera 126 captures all of the plurality of antenna patterns 24A and 24B in the portion of the material sheet S on the elevating stage 124, due to the small size of the coupling portions 24Ab and 24Bb, the positions and orientations of images of the coupling portions in the captured image cannot be identified with a high accuracy, or in some cases, identification failure may occur. For that reason, it is necessary to process the captured image and/or to capture the antenna patterns on the elevating stage 124 one by one with a high-resolution camera. Accordingly, it takes time to identify the positions and orientations of the coupling portions 24Ab and 24Bb of the antenna patterns 24A and 24B, with the result that it takes time to position the terminal electrodes 36A and 36B of the RFIC module 30 with respect to the coupling portions 24Ab and 24Bb.

As for the positioning accuracy, naturally, high positioning accuracy is not required as compared to the case where the RFIC chip 34 is directly mounted on the antenna member 20 without being modularized as the RFIC module 30. That is, in the case of the first and second input/output terminals 34*a* and 34*b* of the RFIC chip 34 having a smaller size and smaller pitch spacing than the terminal electrodes 36A and 36B of the RFIC module 30 as shown in FIG. 4, their positioning accuracy is higher than the positioning accuracy of the terminal electrodes 36A and 36B. For that reason, if not modularized, it takes time for positioning. Therefore, also by modularizing the RFIC chip 34 as the RFIC module 30, the mounting time is shortened.

Next, as shown in FIG. 3, in the stacking direction (e.g., Z-axis direction) of the RFIC module 30, the sticky layer 80, and the antenna member 20, a first region S1 enclosing the terminal electrodes 36A and 36B of the RFIC module 30 in the minimum area is smaller than the sticky layer 80 and lies within the contour line of the sticky layer 80. At the same time, the sticky layer 80 is smaller than and lies within a second region S2 enclosing the coupling portions 24Ab and 24Bb in the minimum area.

By disposing the sticky layer 80 on the coupling portions 24Ab and 24Bb of the antenna patterns 24A and 24B in a larger size than the RFIC module 30 in this manner, the RFIC module 30 can be reliably mounted on the sticky layer 80 when positioning the RFIC module 30 with respect to the coupling portions 24Ab and 24Bb. It is noted that in the captured image of the imaging camera 126, the image of the sticky layer 80 is hard to extract because the contour is irregular and not clear, as compared to the images of the coupling portions 24Ab and 24Bb of the antenna patterns 24A and 24B. For that reason, the position and orientation of the sticky layer 80 is hard to identify based on the captured image. It is therefore difficult to perform positioning with respect to the sticky layer 80.

Further, since the sticky layer 80 is disposed without protruding from the coupling portions 24Ab and 24Bb of the antenna patterns 24A and 24B, the material sheet S can be easily pulled out from the feed reel 110 as compared to the case where the sticky layer 80 is disposed beyond the contours of the coupling portions 24Ab and 24Bb. Further, when wound around the recovery reel 112, the sticky layer 80 is less likely to adhere to the portion of the material sheet S facing it with the RFIC module 30 in between.

According to the exemplary embodiment described above, in the wireless communication device 10 having the antenna patterns 24A and 24B and the RFIC module 30 including the RFIC chip 34, the RFIC module 30 can be mounted on the antenna patterns 24A and 24B in a short time.

Specifically, since the sticky layer 80 is disposed on the material sheet S (i.e., the antenna member 20) instead of the RFIC module 30, the RFIC module 30 can be picked up in a short time.

It is noted that while the exemplary embodiment of the present invention has been described with reference to the above-described embodiment, the exemplary embodiments of the present invention are not limited thereto.

For example, in the case of the above-described embodiment, as shown in FIG. 9, the mounting head 120 of the mounting unit 104 mounting the RFIC modules 30 on the sticky layer 80 on the material sheet S has 12 nozzles 122 so that 12 RFIC modules can be transported at a time from the pickup position to the mounting position. However, in an embodiment different therefrom, the number of the RFIC modules that can be transported at a time from the pickup position to the mounting position may be 12 or more, for example, 24, or less than 12.

Further, in the case of the above-described embodiment, as shown in FIG. 7, around the feed reel 110 and the recovery reel 112, the material sheet S is wound such that the sticky layer 80 lies on the outer peripheral side. However, the embodiment of the present invention is not limited thereto. In an alternative embodiment, around at least one of the feed reel 110 and the recovery reel 112, the material sheet S may be wound such that the sticky layer 80 lies on the central side.

Furthermore, in the case of the above-described embodiment, the RFIC module 30 mounted (temporarily adhered) on the sticky layer 80 by the mounting unit 104 is truly adhered thereon by being wound around the recovery reel 112. However, the embodiment of the present invention is not limited thereto.

Figure 13:
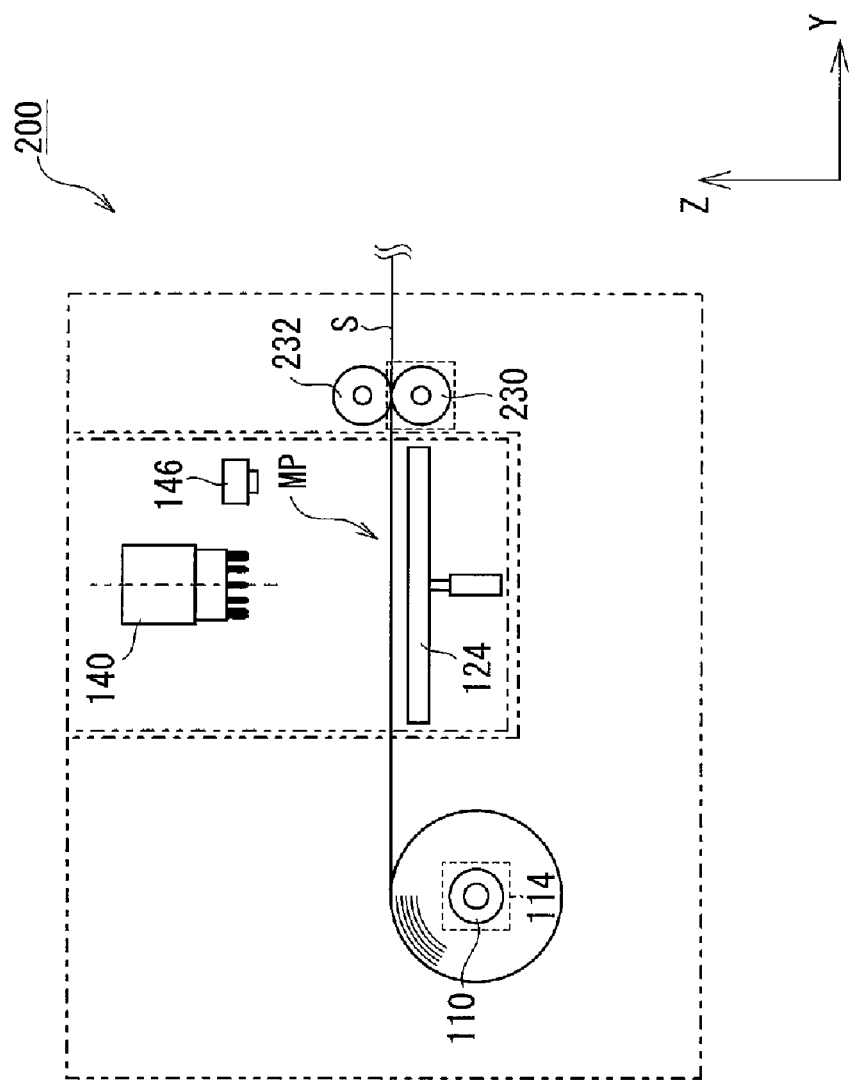
FIG. 13 is a schematic configuration diagram of a wireless communication device manufacturing apparatus according to another exemplary embodiment.

FIG. 13 is a schematic configuration diagram of a wireless communication device apparatus according to another exemplary embodiment.

As shown in FIG. 13, in the case of a wireless communication device manufacturing apparatus 200 according to this exemplary embodiment, a nip roller pair truly adheres the RFIC modules 30 on the sticky layers, instead of truly adhering the RFIC modules 30 on the sticky layers 80 by the recovery reel 112. The nip roller pair is composed of a transport roller 230 transporting the material sheet S and a roller 232 having an outer peripheral surface facing the outer peripheral surface of the transport roller 230.

Since the material sheet S mounted with the RFIC modules 30 is not recovered by the recovery reel, various works can be continuously executed on the material sheet S mounted with the RFIC modules 30. For example, the work of attaching the double-sided tape 12 and the print label 16 shown in FIG. 2 to the material sheet S can be executed. Alternatively, by dividing the material sheet S mounted with the RFIC modules 30, a plurality of antenna members 20 each mounted with the RFIC module 30 can be manufactured.

Furthermore, in the case of the above-described embodiment, as shown in FIG. 7, the insulating sticky layer 80 as the adhesive member for adhering the RFIC module 30 on the material sheet S is disposed on the material sheet S in a state of being wound around the feed reel 110, but the embodiment of the present invention is not limited thereto. The adhesive member may be disposed on the material sheet S, for example, on the coupling portions of the antenna patterns before reaching the mounting position where the RFIC modules are mounted. For example, in an alternative embodiment, the insulating adhesive layer may be disposed on the material sheet by applying an insulating adhesive onto the material sheet lying between the feed reel and the mounting position.

In addition, in the case of the above-described embodiment, as shown in FIG. 2, the antenna patterns 24A and 24B in the antenna base material 22 are made from a metal leaf of silver, copper, or aluminum, for example. The sticky layer 80 as the adhesive member for adhering the RFIC module 30 on this antenna base material 22 is made from a rubber-based, acrylic-based, silicon-based, or urethane-based sticking agent, for example. That is, the antenna patterns and the adhesive member are made of different materials.

In yet another alternative embodiment, the antenna pattern and the adhesive member are made of the same material, for example a photosetting conductive paste. In this case, by using an applicator such as a screen printer, the antenna patterns including the first and second coupling portions are drawn with the photosetting paste on the material sheet before reaching the RFIC module mounting position. Next, at the mounting position, the RFIC module is placed on the first and second coupling portions. Afterward, the conductive paste is hardened by irradiation of light to form the antenna patterns, and the RFIC module is adhered to the material sheet. In the case of this embodiment, part of the first and second coupling portions functions as the adhesive member for adhering the RFIC module to the material sheet. Note that solder plating may be used in place of the photosetting conductive paste.

Moreover, in the case of the above-described embodiment, as shown in FIG. 6, the terminal electrodes 36A and 36B for electrically connecting (e.g., capacitively coupling) to the coupling portions 24Ab and 24Bb of the antenna patterns 24A and 24B are built in the RFIC module 30 and are not exposed to the outside. However, the embodiment of the present invention is not limited thereto.

Figure 14:
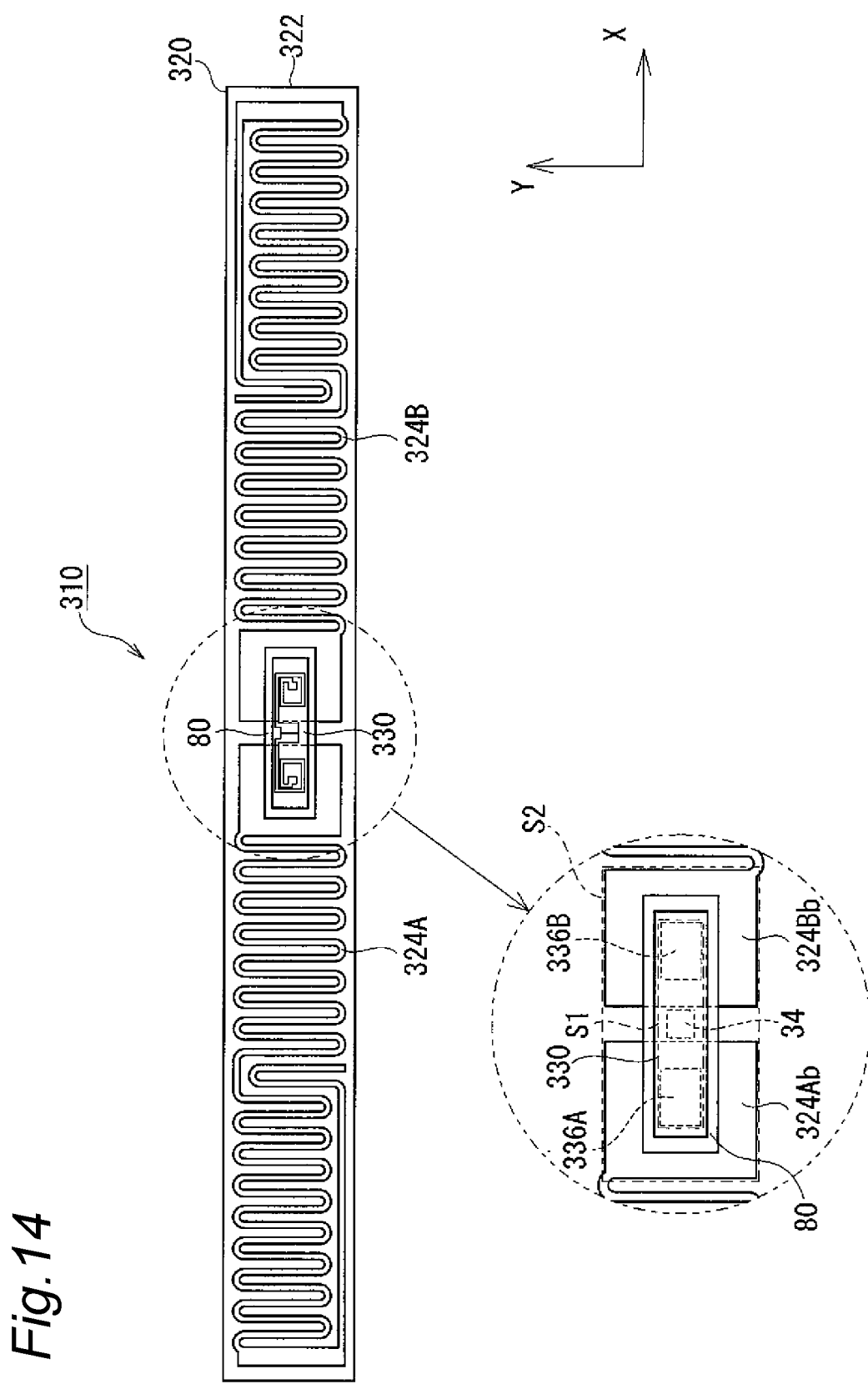
FIG. 14 is a top view of a wireless communication device according to still another exemplary embodiment.
Figure 15:
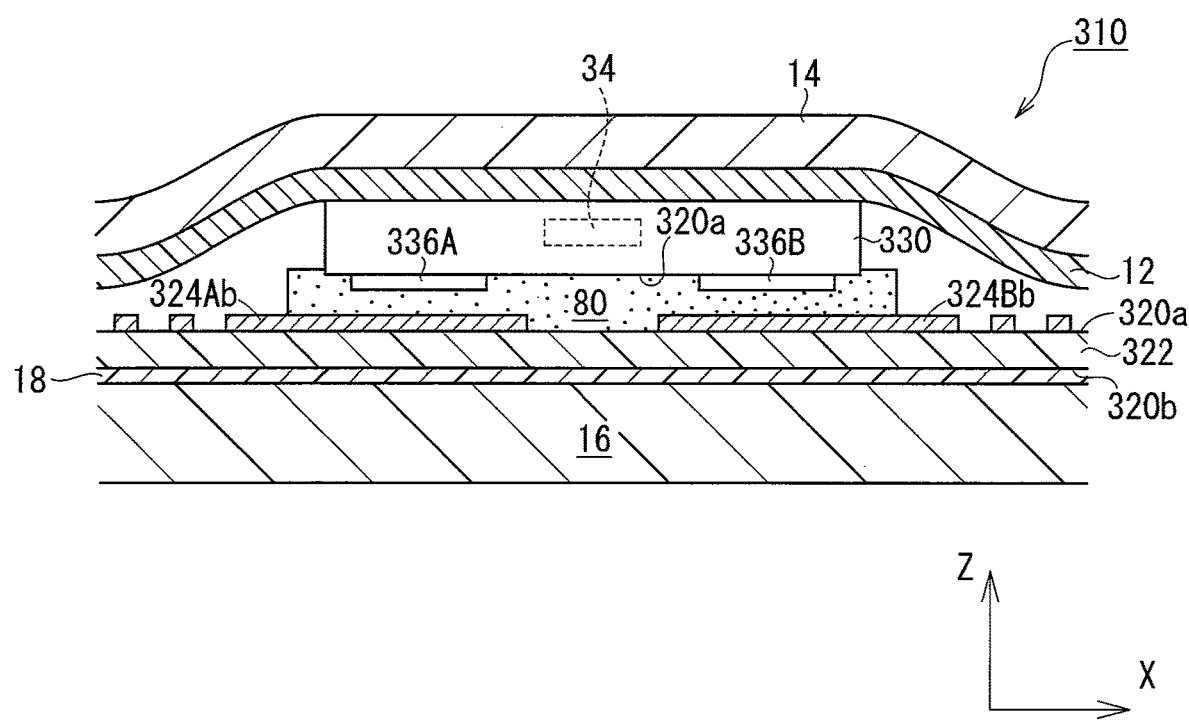
FIG. 15 is a partial cross-sectional view of the wireless communication device shown in FIG. 14.

FIG. 14 is a top view of a wireless communication device according to still another embodiment of the present invention. FIG. 15 is a partial cross-sectional view of the wireless communication device shown in FIG. 14.

As shown in FIG. 14, a wireless communication device 310 according to the still another embodiment has substantially the same structure as the wireless communication device 10 according to the above-described embodiment shown in FIGS. 2 and 3 except for an RFIC module 330 thereof, and hence it is manufactured by substantially the same method. That is, an antenna member 320 of the wireless communication device 310 includes an antenna base material 322 and antenna patterns 324A and 324B disposed on the antenna base material 322 and having coupling portions 324Ab and 324B.

As shown in FIG. 15, the RFIC module 330 in the wireless communication device 310 according to the still another embodiment includes terminal electrodes 336A and 336B for electrically connecting to the coupling portions 324Ab and 324Bb of the antenna patterns 324A and 324B. Different from the terminal electrodes 36A and 36B of the RFIC module 30 in the wireless communication device 10 of the above-described embodiment shown in FIG. 6, these terminal electrodes 336A and 336B are exposed to the outside without being built in the RFIC module 330.

Figure 16:
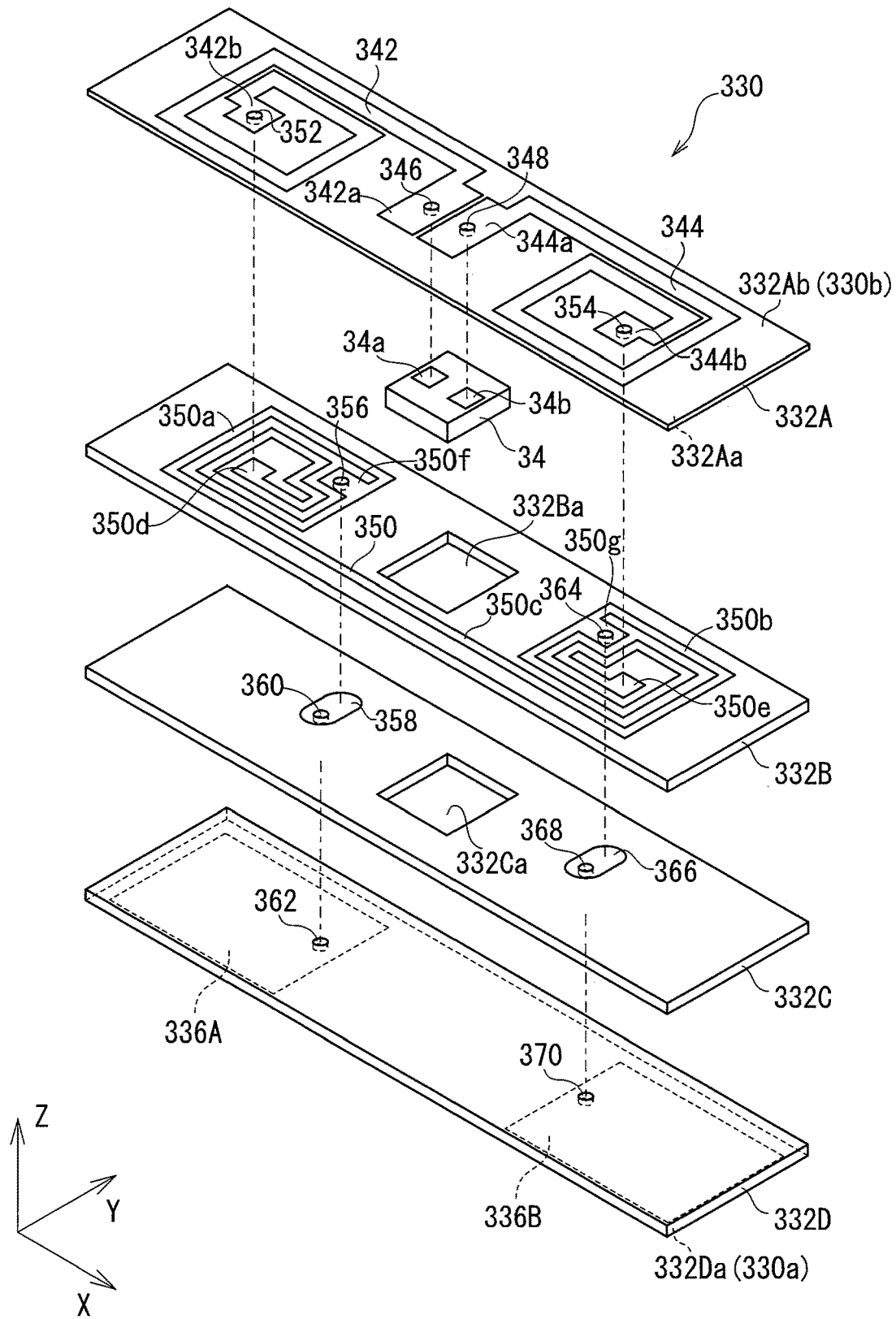
FIG. 16 is an exploded perspective view of an RFIC module in the wireless communication device shown in FIG. 14.
Figure 17:
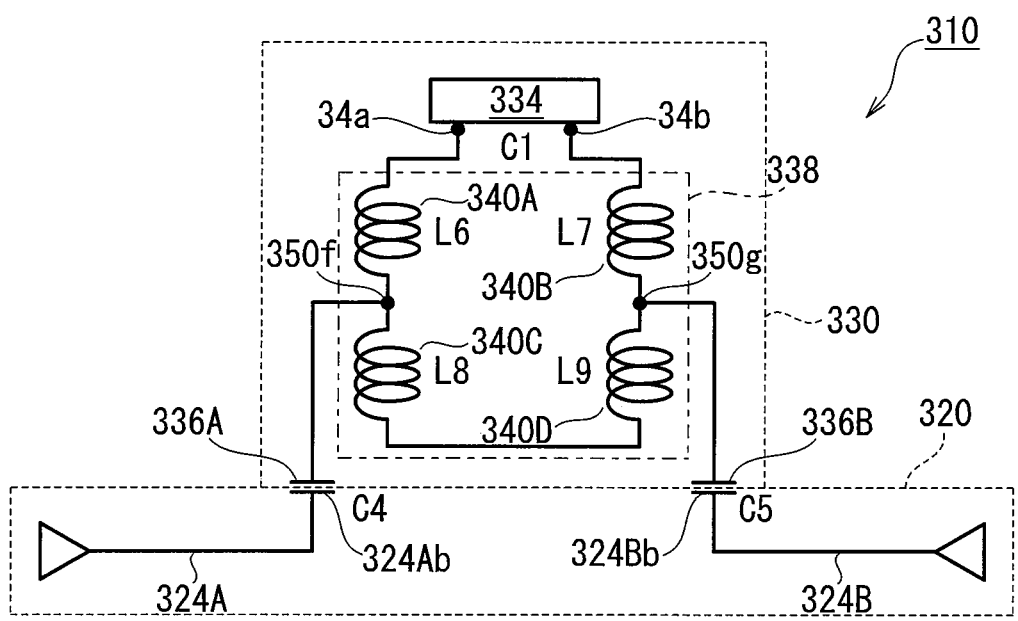
FIG. 17 is an equivalent circuit diagram of the wireless communication device shown in FIG. 14.

FIG. 16 is an exploded perspective view of the RFIC module in the wireless communication device shown in FIG. 14, and FIG. 17 is an equivalent circuit diagram of the wireless communication device shown in FIG. 14.

As shown in FIG. 16, the RFIC module 330 is a strip-shaped (elongated rectangular) multilayer structure. Specifically, the RFIC module 330 includes, as a module base material that is a main component, four thin plate-shaped insulating sheets 332A to 332D made from an insulating material and laminated together.

As shown in FIGS. 16 and 17, the RFIC module 330 includes the RFIC chip 34 and the terminal electrodes 336A and 336B (i.e., the first and second terminal electrodes) connected to the RFIC chip 34. Further, the RFIC module 330 includes a matching circuit 338 disposed between the RFIC chip 34 and the terminal electrodes 336A and 336B.

Further, as shown in FIG. 16, the RFIC chip 34 is built in the RFIC module 330 that is a multilayer structure. Specifically, the RFIC chip 34 is arranged between the insulating sheets 332A and 332D lying on outer sides in the RFIC module 330 and is mounted on an inner surface 332Aa of the insulating sheet 332A. Note that the insulating sheets 332B and 332C sandwiched between the insulating sheets 332A and 332D are formed with through holes 332Ba and 332Ca, respectively, for accommodating the RFIC chip 34.

The terminal electrodes 336A and 336B are conductor patterns made from a conductor material such as silver, copper, or aluminum, for example, and are disposed on an outer surface 332Da of the insulating sheet 332D lying on the outer side in the RFIC module 330 and forming a first main surface 330a of the RFIC module 330.

As shown in FIG. 17, the matching circuit 338 disposed between the RFIC chip 34 and the first and second terminal electrodes 336A and 336B is composed of a plurality of inductance elements 340A to 340D.

The plurality of inductance elements 340A to 340D are each composed of a conductor pattern and an interlayer connecting conductor disposed on each of the insulating sheets 332A to 332D.

On an outer surface 332Ab of the insulating sheet 332A forming a second main surface 330b of the RFIC module 330, there are disposed conductor patterns 342 and 344 made from a conductor material such as silver, copper or aluminum. The conductor patterns 342 and 344 are spiral coil-shaped patterns and include, at outer peripheral ends, land portions 342a and 344a for electrically connecting to the RFIC chip 34. Note that the land portion 342a and the first input/output terminal 34a of the RFIC chip 34 are electrically connected via an interlayer connecting conductor 346 such as a through-hole conductor. The land portion 344a and the second input/output terminal 34b are electrically connected via an interlayer connecting conductor 348.

Moreover, the insulating sheet 332B adjacent to the insulating sheet 332A is disposed with a conductor pattern 350 made from a conductor material such as silver, copper, or aluminum, for example. The conductor pattern 350 includes spiral coil portions 350a and 350b arranged at both ends in the longitudinal direction (e.g., the X-axis direction) of the RFIC module 330 and a connecting portion 350c connecting outer peripheral ends thereof.

A central end 350d of the spiral coil portion 350a on one hand of the conductor pattern 350 is electrically connected to a central end 342b of the spiral coil-shaped conductor pattern 342 via an interlayer connecting conductor 352 formed on the insulating sheet 332A.

A central end 350e of the spiral coil portion 350b on the other of the conductor pattern 350 is electrically connected to a central end 344b of the spiral coil-shaped conductor pattern 344 via an interlayer connecting conductor 354 formed on the insulating sheet 332A.

The spiral coil portions 350a and 350b of the conductor pattern 350 are disposed with connection terminal portions 350f and 350g, respectively, for connecting to the first and second terminal electrodes 336A and 336B.

The connection terminal portion 350f on one hand of the conductor pattern 350 on the insulating sheet 332B is electrically connected to the terminal electrode 336A via an interlayer connecting conductor 356 on the insulating sheet 332B, a conductor pattern 358 and an interlayer connecting conductor 360 on the insulating sheet 332C, and an interlayer connecting conductor 362 on the insulating sheet 332D.

The connection terminal portion 350g on the other of the conductor pattern 350 on the insulating sheet 332B is electrically connected to the second terminal electrode 336B via an interlayer connecting conductor 364 on the insulating sheet 332B, a conductor pattern 366 and an interlayer connecting conductor 368 on the insulating sheet 332C, and an interlayer connecting conductor 370 on the insulating sheet 332D.

The conductor pattern 342 on one hand on the insulating sheet 332A and a portion of the spiral coil portion 350a from the central end 350d to the connection terminal portion 350f make up the inductance element 340A having an inductance L6. Further, a remaining portion of the spiral coil portion 350a forms the inductance element 340C having an inductance L8.

The conductor pattern 344 on the other on the insulating sheet 332A and a portion of the spiral coil portion 350b from the central end 350e to the connection terminal portion 350g make up the inductance element 340B having an inductance L7. Further, the remaining portion of the spiral coil portion 350*b* forms the inductance element 340D having an inductance L9.

By such a matching circuit 338 including the inductance elements 340A to 340D (also including the self-capacitance C1 of the RFIC chip 34), impedances between the RFIC chip 34 and the first and second terminal electrode 336A and 336B are matched at a predetermined frequency (e.g., communication frequency).

Further, as shown in FIG. 15, the terminal electrodes 336A and 336B of the RFIC module 30 exposed to the outside is adhered via the sticky layer 80 to and capacitively coupled to the coupling portions 324Ab and 324Bb in the antenna patterns 324A and 324B of the antenna member 320 (capacitances C4 and C5 are formed as shown in FIG. 5). By such capacitive coupling, the RFIC chip 34 within the RFIC module 330 can perform wireless communication through the antenna patterns 324A and 324B.

Although exemplary embodiments of the present invention have been described above, it should be apparent to those skilled in the art that an embodiment can be combined with at least one other embodiment, as a whole or in part, to obtain a further embodiment according to the present invention.

REFERENCE NUMBERS

24A antenna pattern
24B antenna pattern
24Ab coupling portion (first coupling portion)
24Bb coupling portion (second coupling portion)
30 RFIC module
36A terminal electrode (first terminal electrode)
36B terminal electrode (second terminal electrode)
80 sticky layer
MP mounting position
S material sheet

What is claimed:

1. A method for manufacturing a wireless communication device, the method comprising:
   transporting a material sheet containing one surface having at least one antenna pattern, which includes first and second coupling portions, towards a mounting position;
   applying an adhesive member having a stickiness to the one surface of the material sheet before the material sheet reaches the mounting position;
   picking up, by a mounting device, a radio-frequency integrated circuit (RFIC) module that includes an RFIC chip and first and second terminal electrodes connected to the RFIC chip, at a pickup position;
   mounting, by the mounting device, the picked-up RFIC module onto the adhesive member on the material sheet at the mounting position where the first coupling portion faces the first terminal electrode and the second coupling portion faces the second terminal electrode; and
   winding up, by a recovery reel having a winding shaft with a radius R, the material sheet having the picked-up RFIC module mounted at the mounting position with the other surface of the material sheet contacting the picked-up RFIC module mounted on the adhesive member on the one surface of the material sheet,
   wherein the adhesive member is applied to the material sheet, before the mounting device mounts the picked-up RFIC module onto the adhesive member, to have a protrusion amount B that protrudes past each side of the RFIC module in a winding direction of the recovery reel when the picked-up RFIC module is mounted onto the adhesive member, with the protrusion amount B satisfying Equation 1:

$$B < \left( R \times \cos^{-1}\left( \frac{R}{R+H} \right) \right) \div 2$$

wherein H is a thickness of the picked-up RFIC module.

2. The method of claim 1, further comprising pulling the material sheet having the at least one antenna pattern out from a feed reel around which the material sheet is wound, to be transported towards the mounting position.

3. The method of claim 2, wherein the adhesive member is an insulating sticky layer and is applied on the material sheet in a state of being wound around the feed reel.

4. The method of claim 1, wherein, in a stacking direction of the material sheet, the adhesive member, and the RFIC module, the first coupling portion has a size that is larger than a size of the first terminal electrode, and the second coupling portion has a size that is larger than a size of the second terminal electrode.

5. The method of claim 4, wherein, in the stacking direction, a pitch spacing between the first coupling portion and the second coupling portion and a pitch spacing between the first terminal electrode and the second terminal electrode are defined so that the first terminal electrode lies at a center of the first coupling portion and so that the second terminal electrode lies at a center of the second coupling portion.

6. The method of claim 5, wherein in the stacking direction, a first region enclosing the first and second terminal electrodes in a minimum area is smaller than the adhesive member and lies within a contour line of the adhesive member, and the adhesive member is smaller than a second region enclosing the first and second coupling portions in a minimum area and lies within the second region.

7. The method of claim 1, further comprising sucking and holding the RFIC module by a mounting head of the mounting device that has a plurality of nozzles.

8. The method of claim 7, further comprising transporting the material sheet towards the mounting position while a single nozzle of the plurality of nozzles of the mounting head is picking up the RFIC module at the pickup position.

9. The method of claim 8, further comprising fixing a portion of the material sheet lying at the mounting position while the single nozzle of the plurality of nozzles of the mounting head mounts the RFIC module onto the adhesive member on the material sheet.

10. The method of claim 1, further comprising providing the RFIC module to comprise a matching circuit disposed between the RFIC chip and the first and second terminal electrodes.

11. The method of claim 10, wherein the matching circuit is constructed to match the RFIC chip and the first and second terminal electrodes at a predetermined resonance frequency that is configured as a communication frequency of the wireless communication device.

12. A wireless communication device manufacturing apparatus comprising:
   a transporting device configured to transport a material sheet containing one surface having at least one antenna pattern including first and second coupling portions towards a mounting position;

an applying device configured to apply an adhesive member having a stickiness to the one surface of the material sheet before the material sheet reaches the mounting position;

a mounting device configured to:
- pick up, at a pickup position, a radio-frequency integrated circuit (RFIC) module including an RFIC chip and first and second terminal electrodes connected to the RFIC chip, and
- mount, at the mounting position, the picked-up RFIC module onto the adhesive member on the material sheet at a position where the first coupling portion faces the first terminal electrode and the second coupling portion faces the second terminal electrode; and a recovery reel having a winding shaft with a radius R and being configured to wind up the material sheet having the picked-up RFIC module mounted at the mounting position with the other surface of the material sheet contacting the picked-up RFIC module mounted on the adhesive member on the one surface of the material sheet, wherein the applying device is configured to apply the adhesive member to the material sheet, before the mounting device mounts the picked-up RFIC module onto the adhesive member, to have a protrusion amount B that protrudes past each side of the RFIC module in a winding direction of the recovery reel when the picked-up RFIC module is mounted onto the adhesive member, with the protrusion amount B satisfying Equation 1:

$$B < \left(R \times \cos^{-1}\left(\frac{R}{R+H}\right)\right) \div 2$$

wherein H is a thickness of the picked-up RFIC module.

13. The wireless communication device manufacturing apparatus of claim 12, wherein the mounting device comprises a mounting head with a plurality of nozzles that are each configured to suck and hold an individual RFIC module.

14. The wireless communication device manufacturing apparatus of claim 13, wherein the transporting device is further configured to transport the material sheet towards the mounting position while a single nozzle of the plurality of nozzles of the mounting head is picking up the RFIC module at the pickup position.

15. The wireless communication device manufacturing apparatus of claim 14, wherein the transporting device is further configured to fix a portion of the material sheet lying at the mounting position while the single nozzle of the plurality of nozzles of the mounting head mounts the RFIC module onto the adhesive member on the material sheet.

16. The wireless communication device manufacturing apparatus of claim 12, wherein the adhesive member is an insulating sticky layer and is applied on the material sheet in a state of being wound around a feed reel.

\* \* \* \* \*